(12) United States Patent
Friend et al.

(10) Patent No.: US 11,725,843 B2
(45) Date of Patent: Aug. 15, 2023

(54) BUILDING SYSTEM CONTROL VIA A CLOUD NETWORK

(71) Applicant: Johnson Controls Technology Company, Auburn Hills, MI (US)

(72) Inventors: Richard David Friend, Levittown, PA (US); Justin C. Pasquale, West Chester, PA (US); Gary Hsieh, Philadelphia, PA (US); Rajavardhan Soma, Philadelphia, PA (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 0 days.

(21) Appl. No.: 16/805,395

(22) Filed: Feb. 28, 2020

(65) Prior Publication Data

US 2021/0207832 A1    Jul. 8, 2021

Related U.S. Application Data

(60) Provisional application No. 62/958,600, filed on Jan. 8, 2020.

(51) Int. Cl.
| | |
|---|---|
| *F24F 11/89* | (2018.01) |
| *H05K 5/02* | (2006.01) |
| *F24F 11/52* | (2018.01) |
| *F24F 11/64* | (2018.01) |
| *F24F 11/46* | (2018.01) |
| *F24F 11/65* | (2018.01) |
| *F24F 11/56* | (2018.01) |

(Continued)

(52) U.S. Cl.
CPC .............. *F24F 11/89* (2018.01); *F24F 11/30* (2018.01); *F24F 11/46* (2018.01); *F24F 11/52* (2018.01); *F24F 11/54* (2018.01); *F24F 11/56* (2018.01); *F24F 11/64* (2018.01); *F24F 11/65* (2018.01); *G05B 19/042* (2013.01); *G05B 19/0426* (2013.01); *H05K 5/0204* (2013.01); *F24F 2110/10* (2018.01); *F24F 2120/20* (2018.01); *F24F 2140/50* (2018.01); *F24F 2140/60* (2018.01); *G05B 2219/23258* (2013.01); *G05B 2219/2614* (2013.01)

(58) Field of Classification Search
CPC ........................................... G05B 2219/23258
See application file for complete search history.

(56) References Cited

U.S. PATENT DOCUMENTS

| | | |
|---|---|---|
| 2,888,537 A | 5/1959 | Mears |
| 8,420,956 B2 | 4/2013 | Alderson et al. |

(Continued)

OTHER PUBLICATIONS

Centrica Connected Home Limited, "Hive Active Heating—Thermostat User Guide," England, 2017, 24 pages.

*Primary Examiner* — Nathan L Laughlin
(74) *Attorney, Agent, or Firm* — Foley & Lardner LLP

(57) ABSTRACT

A method for controlling a heating, ventilation, or air conditioning (HVAC) system in a building. The method includes receiving environmental data of the HVAC system via a cloud network and generating an application based on the received environmental data of the HVAC system. The method further includes providing the application to a user interface via the cloud network. The application receives control instructions via the user interface and provides control signals to a plurality of HVAC equipment in the building to satisfy the control instructions.

18 Claims, 26 Drawing Sheets

(51) Int. Cl.
  *G05B 19/042* (2006.01)
  *F24F 11/30* (2018.01)
  *F24F 11/54* (2018.01)
  *F24F 110/10* (2018.01)
  *F24F 140/60* (2018.01)
  *F24F 120/20* (2018.01)
  *F24F 140/50* (2018.01)

(56) References Cited

U.S. PATENT DOCUMENTS

| | | |
|---|---|---|
| 8,802,981 B2 | 8/2014 | Wallaert et al. |
| 9,941,183 B2 | 4/2018 | Read et al. |
| 10,024,568 B1 | 7/2018 | Read et al. |
| 10,648,615 B1 | 5/2020 | Conklin et al. |
| 2005/0165601 A1 | 7/2005 | Gupta et al. |
| 2007/0158442 A1 | 7/2007 | Chapman et al. |
| 2009/0271365 A1* | 10/2009 | Chen ................. G06F 9/451 |
| | | 707/E17.031 |
| 2010/0064061 A1 | 3/2010 | Warren et al. |
| 2010/0289643 A1* | 11/2010 | Trundle ............... G05B 15/02 |
| | | 340/545.1 |
| 2011/0069010 A1 | 3/2011 | Yi et al. |
| 2011/0184574 A1* | 7/2011 | Le Roux ............ H02J 13/0062 |
| | | 700/291 |
| 2012/0232969 A1* | 9/2012 | Fadell .................. G06Q 50/06 |
| | | 705/14.4 |
| 2014/0145978 A1 | 5/2014 | Hsu |
| 2015/0095820 A1* | 4/2015 | Fellman .............. G06F 3/04847 |
| | | 715/765 |
| 2015/0339917 A1* | 11/2015 | Messing .............. G08C 17/02 |
| | | 340/12.5 |
| 2016/0048215 A1 | 2/2016 | Shin et al. |
| 2016/0055105 A1 | 2/2016 | Hsieh et al. |
| 2017/0082313 A1 | 3/2017 | Benichou et al. |
| 2017/0328591 A1* | 11/2017 | Kelly ........................ F24F 11/30 |
| 2018/0136676 A1 | 5/2018 | Sloo et al. |
| 2018/0260188 A1 | 9/2018 | Rossbacher |
| 2018/0283723 A1* | 10/2018 | Ock ....................... G05B 15/02 |
| 2019/0364173 A1 | 11/2019 | Fleizach et al. |
| 2020/0233500 A1 | 7/2020 | Mannby |

* cited by examiner

BUILDING SYSTEM CONTROL VIA A CLOUD NETWORK

CROSS-REFERENCE TO RELATED PATENT APPLICATIONS

This application claims priority from U.S. Provisional Application No. 62/958,600, filed Jan. 8, 2020, incorporated herein by reference in its entirety.

BACKGROUND

The present disclosure relates generally to building systems that control environmental conditions of a building. The present disclosure relates more particularly to thermostats of a building system.

Systems of a building may include various controllers configured to generate control decisions for heating or cooling equipment or systems. The controllers can, in some cases, be thermostats. Thermostats can be utilized in both residential and commercial building systems. Thermostats can receive, or themselves measure, environmental conditions such as temperature and generate control decisions based on setpoints and/or the measured temperature for operating the heating or cooling equipment or systems. Thermostats include physical displays for presenting measured or control information to a user and for receiving input from the user, e.g., a user desired setpoint or operating schedule.

SUMMARY

One implementation of the present disclosure is a method for controlling a heating, ventilation, or air conditioning (HVAC) system in a building. The method includes receiving environmental data of the HVAC system via a cloud network. The method further includes generating an application based on the received environmental data of the HVAC system. The method further includes providing the application to a user interface via the cloud network. The application receives control instructions via the user interface and provides control signals to a plurality of HVAC equipment in the building to satisfy the control instructions.

In some embodiments, generating the application further includes generating an application on one or more servers via a processing circuit, the processing circuit including one or more processors and memory.

In some embodiments, the application provides a widget to generate a model based on the received environmental data, determine a set of recommendations based on the received environmental data, and provide the set of recommendations to the user interface.

In some embodiments, the application provides a widget to receive control signals based on a set of sleep preferences of a user of the user interface, determine a first set of control signals for the plurality of HVAC equipment based on the set of sleep preferences of the user, and provide the first set of control signals to the plurality of HVAC equipment.

In some embodiments, the application further receives utility data via a utility provider and determines a second set of control signals configured to increase a savings on energy based on the received utility data. In some embodiments, the savings comprises financial savings or energy savings or both. In some embodiments, the application further provides the second set of control signals to the plurality of HVAC equipment.

In some embodiments, the application receives control signals based on a set of pet preferences of a user of the user interface and determines a third set of control signals for the plurality of HVAC equipment based on the set of pet preferences. In some embodiments, the application further provides the third set of control signals to the plurality of HVAC equipment.

In some embodiments, the application further receives air quality data of the HVAC system and determines a fourth set of control signals for the plurality of HVAC equipment configured to increase a quality of air in the HVAC system. In some embodiments, the application further provides the fourth set of control signals to the plurality of HVAC equipment.

Another implementation of the present disclosure is a system for personalizing heating, ventilation, or air conditioning (HVAC) controls in a building. The system includes a plurality of HVAC equipment, a plurality of sensors, and a user device. The system further includes a cloud server including a processing circuit. In some embodiments, the processing circuit includes one or more processors and memory storing instructions that, when executed by the one or more processors, cause the one or more processors to perform operations. The operations include receiving environmental data of the HVAC system via a cloud network. The operations further include generating an application based on the received environmental data of the HVAC system. The operations further include providing the application to a user interface via the cloud network. The application receives control instructions via the user interface and provides control signals to a plurality of HVAC equipment in the building to satisfy the control instructions.

In some embodiments, generating the application further includes generating an application on one or more servers via a processing circuit, the processing circuit including one or more processors and memory.

In some embodiments, the application provides a widget to generate a model based on the received environmental data, determine a set of recommendations based on the received environmental data, and provide the set of recommendations to the user interface.

In some embodiments, the application provides a widget to receive control signals based on a set of sleep preferences of a user of the user interface, determine a first set of control signals for the plurality of HVAC equipment based on the set of sleep preferences of the user, and provide the first set of control signals to the plurality of HVAC equipment.

In some embodiments, the application further receives utility data via a utility provider and determines a second set of control signals configured to increase a savings on energy based on the received utility data. In some embodiments, the savings comprises financial savings or energy savings or both. In some embodiments, the application further provides the second set of control signals to the plurality of HVAC equipment.

In some embodiments, the application receives control signals based on a set of pet preferences of a user of the user interface and determines a third set of control signals for the plurality of HVAC equipment based on the set of pet preferences. In some embodiments, the application further provides the third set of control signals to the plurality of HVAC equipment.

In some embodiments, the application further receives air quality data of the HVAC system and determines a fourth set of control signals for the plurality of HVAC equipment configured to increase a quality of air in the HVAC system.

In some embodiments, the application further provides the fourth set of control signals to the plurality of HVAC equipment.

In some embodiments, the cloud server is located off-premises at a different location than the user device.

Another implementation of the present disclosure is a method of personalizing a heating, ventilation, or air conditioning (HVAC) control system. The method includes receiving environmental data of the HVAC system via a cloud network. The method further includes generating an application based on the received environmental data of the HVAC system. The method further includes providing the application to a user interface via the cloud network. The application generates a model based on the received environmental data, determines a set of recommendations based on the received environmental data, and provides the set of recommendations to the user interface.

In some embodiments, generating the application further includes generating an application on one or more servers via a processing circuit, the processing circuit including one or more processors and memory.

In some embodiments, the application provides a widget to receive control signals based on a set of sleep preferences of a user of the user interface, determine a first set of control signals for the plurality of HVAC equipment based on the set of sleep preferences of the user, and provide the first set of control signals to the plurality of HVAC equipment.

In some embodiments, the application further receives utility data via a utility provider and determines a second set of control signals configured to increase a savings on energy based on the received utility data. In some embodiments, the savings comprises financial savings or energy savings or both. In some embodiments, the application further provides the second set of control signals to the plurality of HVAC equipment.

In some embodiments, the application receives control signals based on a set of pet preferences of a user of the user interface and determines a third set of control signals for the plurality of HVAC equipment based on the set of pet preferences. In some embodiments, the application further provides the third set of control signals to the plurality of HVAC equipment.

In some embodiments, the application further receives air quality data of the HVAC system and determines a fourth set of control signals for the plurality of HVAC equipment configured to increase a quality of air in the HVAC system. In some embodiments, the application further provides the fourth set of control signals to the plurality of HVAC equipment.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Overview

Referring generally to the FIGURES, an application for controlling a heating, ventilation, or air conditioning (HVAC) system is shown. Residents of a building (e.g., home, campus, office, etc.) may control various temperatures of one or more zones within the building by means of a thermostat. Users may interact with the control system by means of an application (e.g., phone application, computer application, etc.) that is connected wirelessly to the HVAC control system. Typically, various servers and/or controllers are required within the control system to facilitate control logic and provide instructions for operating the control system (e.g., providing control signals to building equipment). This can be time consuming and expensive per the installation costs of the servers/controllers. Accordingly, there exists a need for a method of wireless controlling a residential HVAC system using a network of remote servers hosted to a network without the need for a local server device.

Commercial and Residential HVAC Systems with a Thermostat

Figure 1:
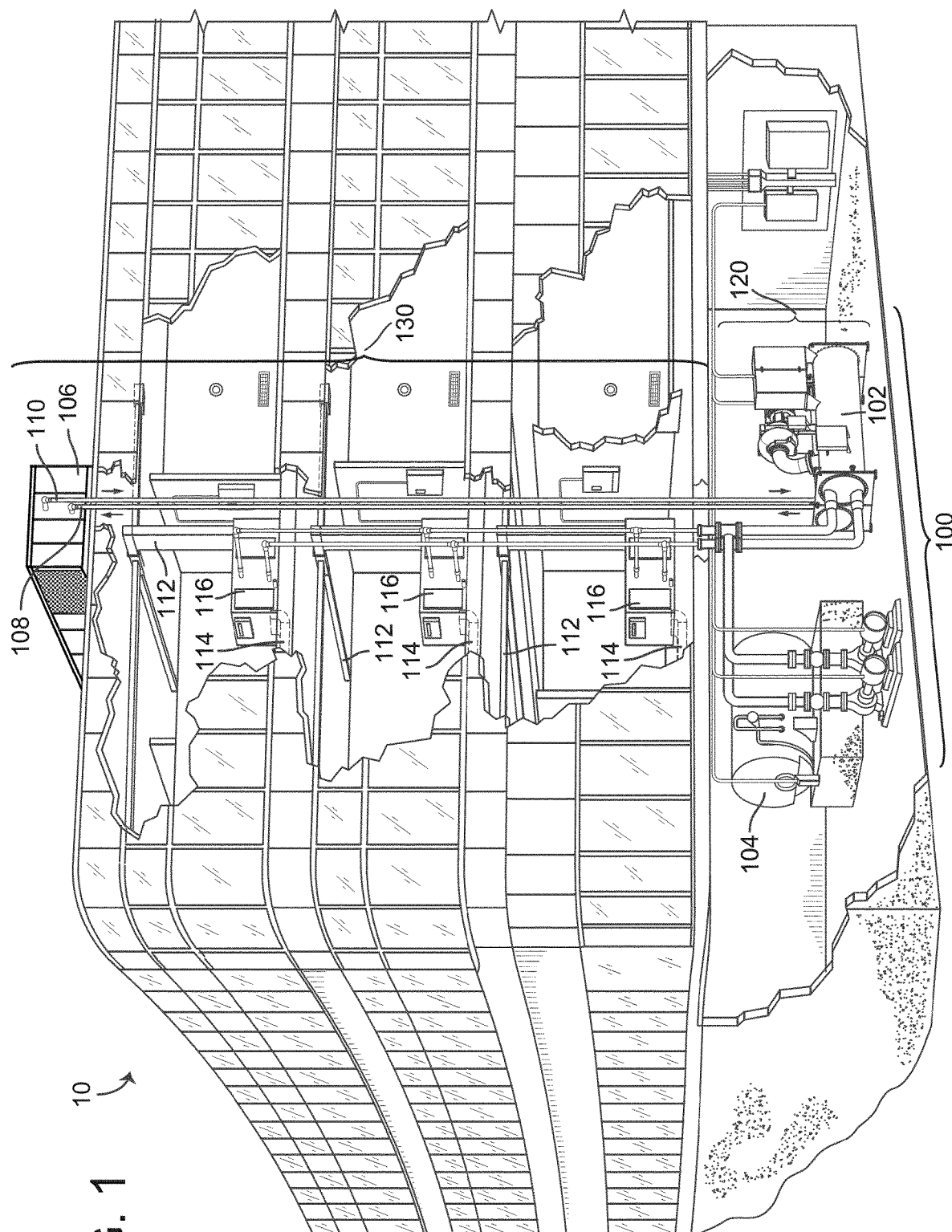
FIG. 1 is a perspective schematic drawing of a building equipped with a HVAC system, according to some embodiments.

Referring now to FIG. 1, an exemplary building management system (BMS) and HVAC system in which the systems and methods of the present invention can be implemented are shown, according to an exemplary embodiment. In FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve set-point conditions for the building zone.

Figure 2:
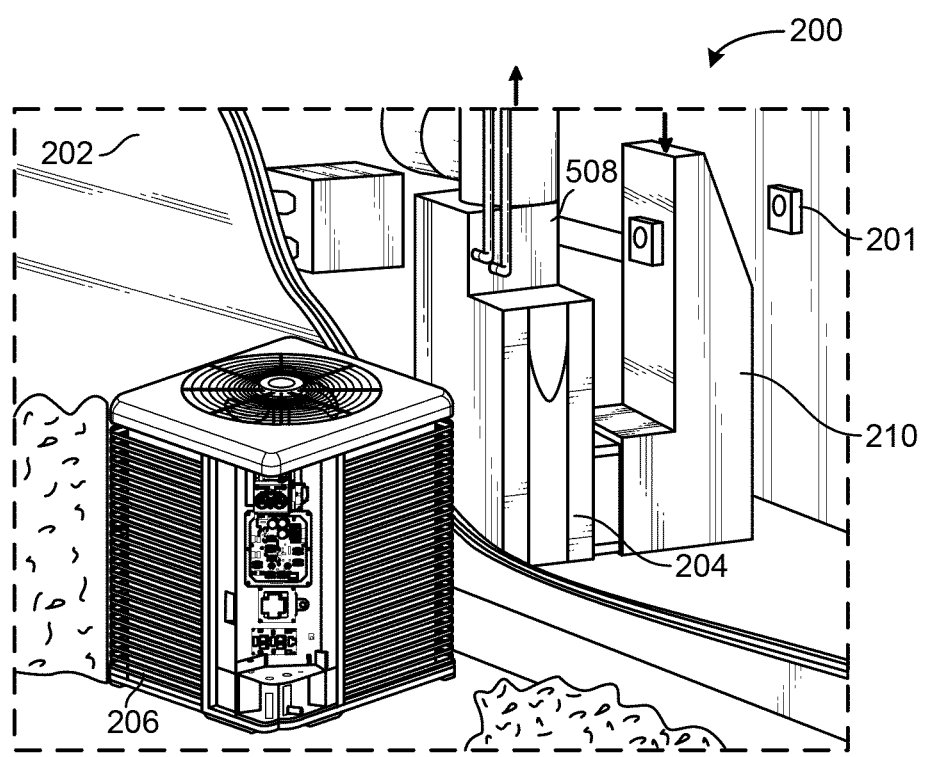
FIG. 2 is a perspective schematic drawing of a building equipped with a residential heating and cooling system which can be implemented in the building of FIG. 1, according to some embodiments.

Referring now to FIG. 2, a residential heating and cooling system 200 is shown, according to an exemplary embodiment. The residential heating and cooling system 200 may provide heated and cooled air to a residential structure. Although described as a residential heating and cooling system 200, embodiments of the systems and methods described herein can be utilized in a cooling unit or a heating unit in a variety of applications including commercial HVAC units (e.g., roof top units). In general, a residence 202 includes refrigerant conduits that operatively couple an indoor unit 204 to an outdoor unit 206. Indoor unit 204 may be positioned in a utility space, an attic, a basement, and so forth. Outdoor unit 206 is situated adjacent to a side of residence 202. Refrigerant conduits transfer refrigerant between indoor unit 204 and outdoor unit 206, typically transferring primarily liquid refrigerant in one direction and primarily vaporized refrigerant in an opposite direction.

When the system 200 shown in FIG. 2 is operating as an air conditioner, a coil in outdoor unit 206 serves as a condenser for recondensing vaporized refrigerant flowing from indoor unit 204 to outdoor unit 206 via one of the refrigerant conduits. In these applications, a coil of indoor unit 204, designated by the reference numeral 208, serves as an evaporator coil. Evaporator coil 208 receives liquid refrigerant (which may be expanded by an expansion device, not shown) and evaporates the refrigerant before returning it to outdoor unit 206.

Outdoor unit 206 draws in environmental air through its sides, forces the air through the outer unit coil using a fan, and expels the air. When operating as an air conditioner, the air is heated by the condenser coil within outdoor unit 206 and exits the top of the unit at a temperature higher than it entered the sides. Air is blown over indoor coil 208 and is then circulated through residence 202 by means of ductwork 210, as indicated by the arrows entering and exiting ductwork 210. The overall system 200 operates to maintain a desired temperature as set by thermostat 201. When the temperature sensed inside residence 202 is higher than the setpoint on thermostat 201 (with the addition of a relatively small tolerance), the air conditioner will become operative to refrigerate additional air for circulation through residence 202. When the temperature reaches the setpoint (with the removal of a relatively small tolerance), the unit can stop the refrigeration cycle temporarily.

In some embodiments, system 200 is configured so that outdoor unit 206 is controlled to achieve better control over temperature and humidity within residence 202. Outdoor unit 206 is controlled to operate components within outdoor unit 206 and system 200, based on a percentage of a delta between a minimum operating value of the compressor and a maximum operating value of the compressor, plus the minimum operating value. In some embodiments, the minimum operating value and the maximum operating value are based on the determined outdoor ambient temperature, and the percentage of the delta is based on a predefined temperature differential multiplier and one or more time dependent multipliers.

Figure 3:
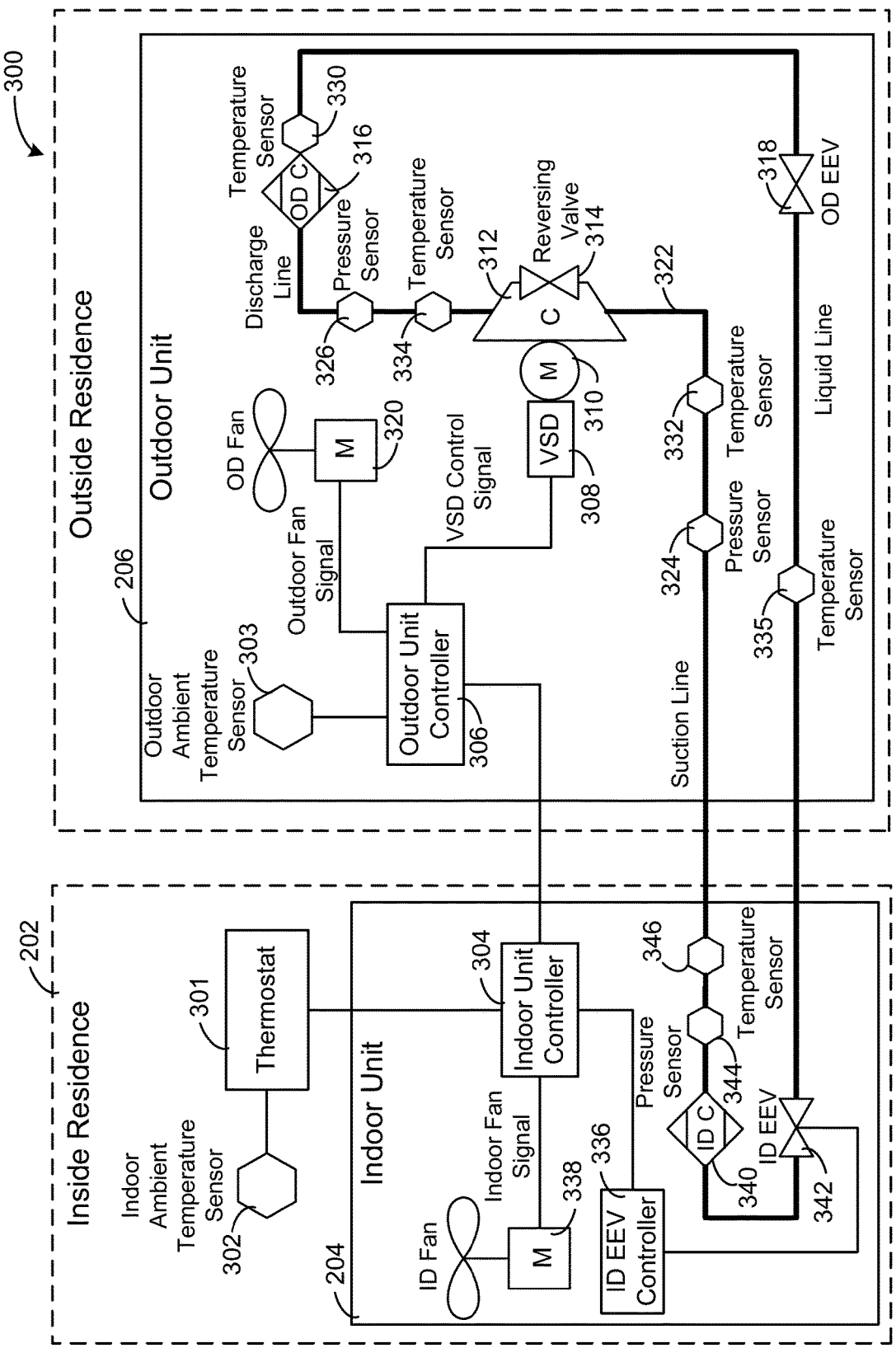
FIG. 3 is a diagram of a residential heating and cooling system which can be implemented in the building of FIG. 1, according to some embodiments.

Referring now to FIG. 3, a HVAC system 300 is shown according to an exemplary embodiment. Various components of system 300 are located inside residence 202 while other components are located outside residence 202. Outdoor unit 206, as described with reference to FIG. 2, is shown to be located outside residence 202, while indoor unit 204 and thermostat 301 are shown to be located inside residence 202. In various embodiments, thermostat 301 can cause indoor unit 204 and outdoor unit 206 to heat residence 202. In some embodiments, thermostat 301 can cause indoor unit 204 and outdoor unit 206 to cool residence 202. In other embodiments, thermostat 301 can command an airflow change within residence 202 to adjust the humidity within residence 202.

Thermostat 301 can be configured to generate control signals for indoor unit 204 and/or outdoor unit 206. Thermostat 301 is shown to be connected to an indoor ambient temperature sensor 302, and an outdoor unit controller 306 is shown to be connected to an outdoor ambient temperature sensor 303. Indoor ambient temperature sensor 302 and outdoor ambient temperature sensor 303 may be any kind of temperature sensor (e.g., thermistor, thermocouple, etc.). Thermostat 301 may measure the temperature of residence 202 via indoor ambient temperature sensor 302. Further, thermostat 301 can be configured to receive the temperature outside residence 202 via communication with outdoor unit controller 306. In various embodiments, thermostat 301 generates control signals for indoor unit 204 and outdoor unit 206 based on the indoor ambient temperature (e.g., measured via indoor ambient temperature sensor 302), the outdoor temperature (e.g., measured via outdoor ambient temperature sensor 303), and/or a temperature setpoint.

Indoor unit 204 and outdoor unit 206 may be electrically connected. Further, indoor unit 204 and outdoor unit 206 may be coupled via conduits 322. Outdoor unit 206 can be configured to compress refrigerant inside conduits 322 to either heat or cool the building based on the operating mode of indoor unit 204 and outdoor unit 206 (e.g., heat pump operation or air conditioning operation). The refrigerant inside conduits 322 may be any fluid that absorbs and extracts heat. For example, the refrigerant may be hydro fluorocarbon (HFC) based R-410A, R-407C, and/or R-134a.

Outdoor unit 206 is shown to include the outdoor unit controller 306, a variable speed drive 308, a motor 310 and a compressor 312. Outdoor unit 206 can be configured to control compressor 312 and to further cause compressor 312 to compress the refrigerant inside conduits 322. In this regard, compressor 312 may be driven by variable speed drive 308 and motor 310. For example, outdoor unit controller 306 can generate control signals for variable speed drive 308. Variable speed drive 308 (e.g., an inverter, a variable frequency drive, etc.) may be an AC-AC inverter, a DC-AC inverter, and/or any other type of inverter. Variable speed drive 308 can be configured to vary the torque and/or speed of motor 310, which in turn drives the speed and/or torque of compressor 312. Compressor 312 may be any suitable compressor such as a screw compressor, a reciprocating compressor, a rotary compressor, a swing-link compressor, a scroll compressor, or a turbine compressor, etc.

In some embodiments, outdoor unit controller 306 is configured to process data received from thermostat 301 to determine operating values for components of system 300, such as compressor 312. In one embodiment, outdoor unit controller 306 is configured to provide the determined operating values for compressor 312 to variable speed drive 308, which controls the speed of compressor 312. Outdoor unit controller 306 is controlled to operate components within outdoor unit 206 and indoor unit 204, based on a percentage of a delta between a minimum operating value of the compressor and a maximum operating value of the compressor, plus the minimum operating value. In some embodiments, the minimum operating value and the maximum operating value are based on the determined outdoor ambient temperature, and the percentage of the delta is based on a predefined temperature differential multiplier and one or more time dependent multipliers.

In some embodiments, outdoor unit controller 306 can control a reversing valve 314 to operate system 300 as a heat pump or an air conditioner. For example, outdoor unit controller 306 may cause reversing valve 314 to direct compressed refrigerant to indoor coil 208 while in heat pump mode and to an outdoor coil 316 while in air conditioner mode. In this regard, indoor coil 208 and outdoor coil 316 can both act as condensers and evaporators depending on the operating mode (i.e., heat pump or air conditioner) of system 300.

Further, in various embodiments, outdoor unit controller 306 can be configured to control and/or receive data from an outdoor electronic expansion valve (EEV) 318. Outdoor electronic expansion valve 318 may be an expansion valve controlled by a stepper motor. In this regard, outdoor unit controller 306 can be configured to generate a step signal (e.g., a PWM signal) for outdoor electronic expansion valve 318. Based on the step signal, outdoor electronic expansion valve 318 can be held fully open, fully closed, partial open, etc. In various embodiments, outdoor unit controller 306 can be configured to generate a step signal for outdoor electronic expansion valve 318 based on a subcool and/or superheat value calculated from various temperatures and pressures measured in system 300. In one embodiment, outdoor unit controller 306 is configured to control the position of outdoor electronic expansion valve 318 based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

Outdoor unit controller 306 can be configured to control and/or power an outdoor fan 320. Outdoor fan 320 can be configured to blow air over outdoor coil 316. In this regard, outdoor unit controller 306 can control the amount of air blowing over outdoor coil 316 by generating control signals to control the speed and/or torque of outdoor fan 320. In some embodiments, the control signals are pulse wave modulated signals (PWM), analog voltage signals (i.e., varying the amplitude of a DC or AC signal), and/or any other type of signal. In one embodiment, outdoor unit controller 306 can control an operating value of outdoor fan 320, such as speed, based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

Outdoor unit 206 may include one or more temperature sensors and one or more pressure sensors. The temperature sensors and pressure sensors may be electrically connected (i.e., via wires, via wireless communication, etc.) to outdoor unit controller 306. In this regard, outdoor unit controller 306 can be configured to measure and store the temperatures and pressures of the refrigerant at various locations of conduits 322. The pressure sensors may be any kind of transducer that can be configured to sense the pressure of the refrigerant in conduits 322. Outdoor unit 206 is shown to include a pressure sensor 324. Pressure sensor 324 may measure the pressure of the refrigerant in conduits 322 in the suction line (i.e., a predefined distance from the inlet of compressor 312). Further, outdoor unit 206 is shown to include a pressure sensor 326. Pressure sensor 326 may be configured to measure the pressure of the refrigerant in conduits 322 on the discharge line (e.g., a predefined distance from the outlet of compressor 312).

The temperature sensors of outdoor unit 206 may include thermistors, thermocouples, and/or any other temperature sensing device. Outdoor unit 206 is shown to include temperature sensor 330, temperature sensor 332, temperature sensor 334, and temperature sensor 335. Temperature sensors (i.e., temperature sensor 330, temperature sensor 332, temperature sensor 335, and/or temperature sensor 346) can be configured to measure the temperature of the refrigerant at various locations inside conduits 322.

Referring now to indoor unit 204, indoor unit 204 is shown to include an indoor unit controller 304, an indoor electronic expansion valve controller 336, an indoor fan 338, an indoor coil 340, an indoor electronic expansion valve 342, a pressure sensor 344, and a temperature sensor 346. Indoor unit controller 304 can be configured to generate control signals for indoor electronic expansion valve controller 342. The signals may be setpoints (e.g., temperature setpoint, pressure setpoint, superheat setpoint, subcool setpoint, step value setpoint, etc.). In this regard, indoor electronic expansion valve controller 336 can be configured to generate control signals for indoor electronic expansion valve 342. In various embodiments, indoor electronic expansion valve 342 may be the same type of valve as outdoor electronic expansion valve 318. In this regard, indoor electronic expansion valve controller 336 can be configured to generate a step control signal (e.g., a PWM wave) for controlling the stepper motor of indoor electronic expansion valve 342. In this regard, indoor electronic expansion valve controller 336 can be configured to fully open, fully close, or partially close indoor electronic expansion valve 342 based on the step signal.

Indoor unit controller 304 can be configured to control indoor fan 338. Indoor fan 338 can be configured to blow air over indoor coil 340. In this regard, indoor unit controller 304 can control the amount of air blowing over indoor coil 340 by generating control signals to control the speed and/or torque of indoor fan 338. In some embodiments, the control signals are pulse wave modulated signals (PWM), analog voltage signals (i.e., varying the amplitude of a DC or AC signal), and/or any other type of signal. In one embodiment, indoor unit controller 304 may receive a signal from outdoor unit controller 306 indicating one or more operating values, such as the speed for indoor fan 338. In one embodiment, the operating value associated with indoor fan 338 is an airflow, such as cubic feet per minute (CFM). In one embodiment, outdoor unit controller 306 may determine the operating value of indoor fan 338 based on a percentage of a delta between a minimum operating value of the compressor and a maximum operating value of the compressor plus the minimum operating value. In some embodiments, the minimum operating value and the maximum operating value are based on the determined outdoor ambient temperature, and the percentage of the delta is based on a predefined temperature differential multiplier and one or more time dependent multipliers.

Indoor unit controller 304 may be electrically connected (e.g., wired connection, wireless connection, etc.) to pressure sensor 344 and/or temperature sensor 346. In this regard, indoor unit controller 304 can take pressure and/or temperature sensing measurements via pressure sensor 344 and/or temperature sensor 346. In one embodiment, pressure sensor 344 and temperature sensor 346 are located on the suction line (i.e., a predefined distance from indoor coil 340). In other embodiments, pressure sensor 344 and/or temperature sensor 346 may be located on the liquid line (i.e., a predefined distance from indoor coil 340).

Figure 4A:
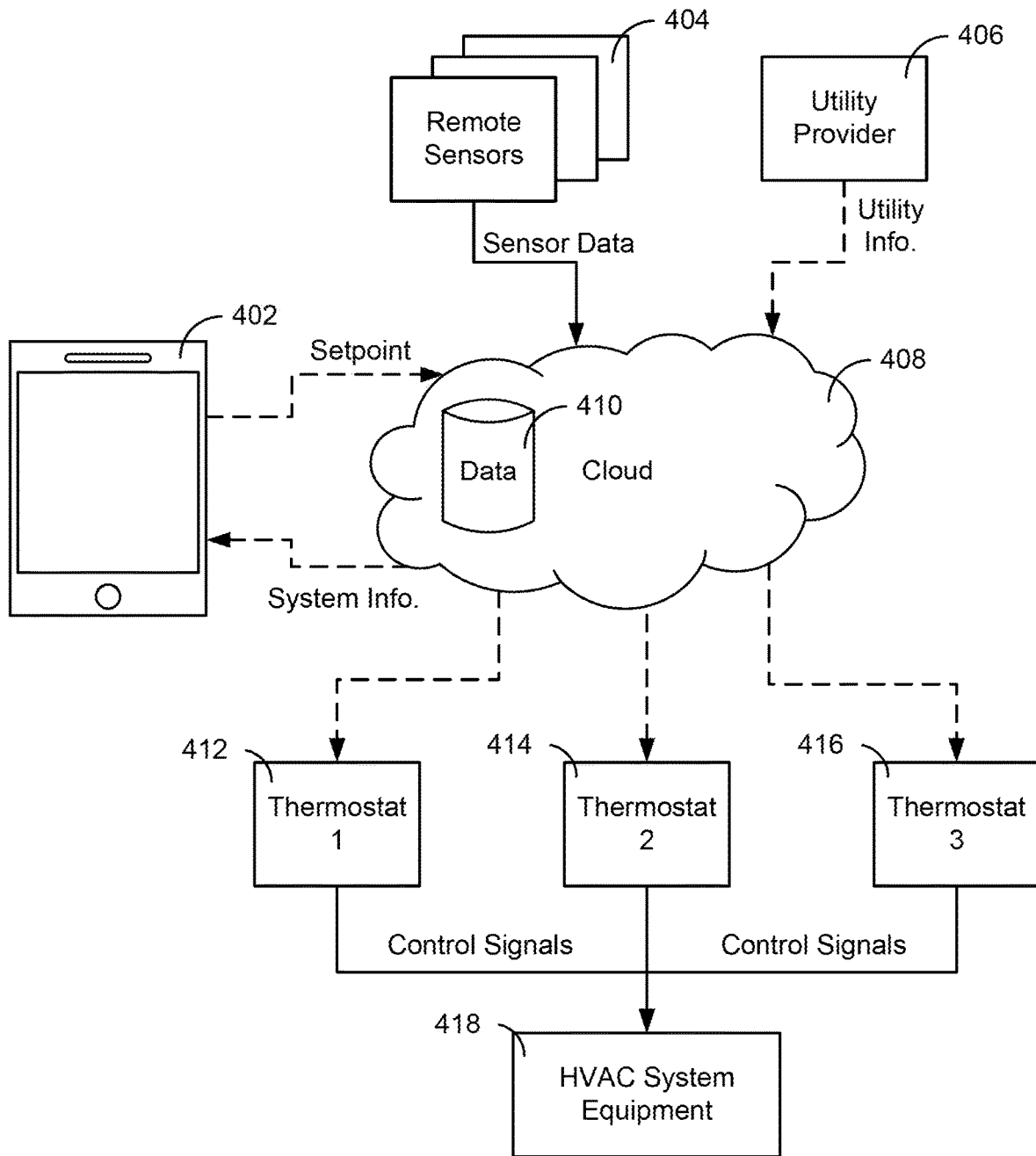
FIG. 4A is a block diagram of a thermostat control system, according to some embodiments.

Referring now to FIG. 4A, a control system 400 is shown. Control system 400 is shown to include a user device 402, remote sensors 404, a utility provider 406, a cloud 408, thermostats 412-416, and HVAC system equipment 418. Control system 400 may include some or all of the functionality of HVAC system 300.

User device 402 may be any device (e.g., cellphone, tablet, laptop, computer, etc.) capable of providing a user interface to a user. In some embodiments, user device 402 is a cellphone capable of downloading a thermostat application (e.g., the application described herein with reference to FIGS. 5-24 as detailed below, etc.) and providing that thermostat application to a user via the user interface of the cell phone. In other embodiments, user device 402 is a workstation that can receive the thermostat application (e.g., "the application") via a wireless connection (e.g., cloud 408) or a wired connection.

Figure 4B:
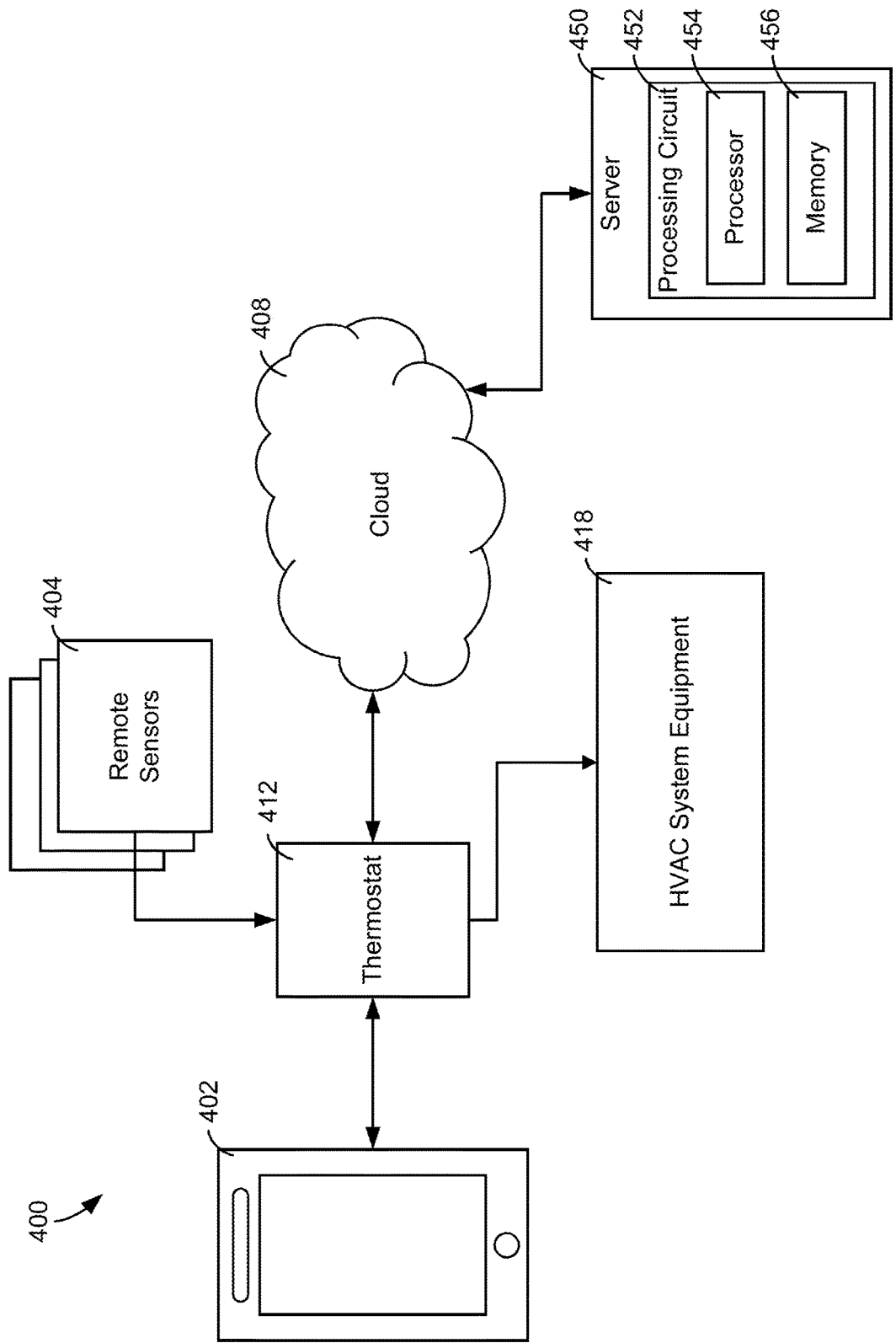
FIG. 4B is a block diagram of a thermostat control system which can be used in the system of FIG. 4A, according to some embodiments.

Remote sensors 404 can be any type of device capable of recording/monitoring environmental data and transmitting that data back to a processing device. In some embodiments, remote sensors 404 record temperature data in one or more building zones (e.g., bathroom, office, basement, etc.) and provide the temperature data to a processing device. In some embodiments, the processing device (e.g., controller, thermostat, etc.) may be located in cloud 408 as shown in FIG. 4B.

Utility provider 406 can be any company capable of providing a utility (e.g., electricity, water, etc.) to a residence or building. In some embodiments, utility provider 406 provides one or more utilities to the residence in which control system 400 is located. Utility provider 406 may further provide utility information to a processing device in control system 400. For example, utility provider 406 may provide on and off-peak rates, utility benefits, and other promotional offers to user device 402 on a thermostat application, via a user interface on user device 402. The utility information may reside in cloud 408 until user device 402 requests the utility information.

Cloud 408 may include programming that relies on sharing computing resources rather than having local devices (e.g., local serves, local computers, etc.) handle applications. Cloud 408 may be responsible for sharing any applications, storage, services, or any other computational processing required in control system 400. In some embodiments, cloud 408 is a model for enabling on-demand network access to a shared pool of configurable computing resources (e.g., networks, servers, storage, applications, and services) that can be rapidly provisioned. Cloud 408 is shown to include data storage 410. Data storage 410 may store data from one or more elements of control system 400 (e.g., utility provider 406, remote sensors 404, etc.).

Thermostats 412-416 may be identical or substantially similar to one or more thermostats disclosed in the present application (e.g., thermostat 301). In some embodiments, thermostats 412-416 receive temperature setpoints from a controller within cloud 408, and provide control signals to various HVAC equipment (chillers, heaters, dampers, etc.) within HVAC system equipment 418. Thermostats 412-416 may send information to and receive information from user device 402. For example, user device 402 may provide a temperature setpoint to thermostat 412, via cloud 408.

In some embodiments, the processing required by thermostats 412-416 (e.g., providing control signals to HVAC equipment, send status updates to device 402, processing sensor data from remote sensors 404, etc.) may be performed in one or more servers located off-premises (e.g., at a building location separate from system 400). For example, system 400 may be installed and located in a residential home, and device 402 is operated by a user who lives in the home. The user may interact with a phone application (i.e., app) (herein, "the application") that allows the user to monitor, change, and/or control functionality of system 400 (e.g., change temperature setpoints, etc.). The signals from device 402 may travel over interconnected networks (e.g., the Internet) to one or more servers located in a different location (e.g., a data center). The one or more servers may then process the request from the user and provide signals in response to the signal from the user, including control signals back to HVAC system equipment 418 or updates back to user device 402. In some embodiments, the entire application is centrally hosted at a data center and is a Software as a service (SaaS). In other embodiments, the application is an infrastructure as a service (IaaS) or a platform as a service (PaaS). In other embodiments, the application is not processed via cloud computing, and may be accessed via a web browser.

Referring now to FIG. 4B, another embodiment of system 400 is shown, according to some embodiments. System 400 may be configured to personalize an application for controlling one or more features of a HVAC control system. FIG. 4B is shown to include a server 450. Server 450 may be any medium for storing and/or processing information for system 400. In some embodiments, server 450 is located off-premises (e.g., at a location other than system 400, etc.) and may provide control applications as software as a service (SaaS). In some embodiments, server 450 stores information received from user device 402 and remote sensors 404, processes the received information, and provides information to user device 402 in the form of an application. In some embodiments, the information is transmitted via cloud 408, as shown in FIG. 4B. Server 450 may be responsible for processing and storing some or all information relating to the application described herein (e.g., an application for user device 402 to control and personalize system 400). This may include generating, storing, and processing the various widgets described below with reference to FIGS. 5-24.

Server 450 is shown to include a processing circuit 452 including a processor 454 and memory 456. Processing circuit 452 can be communicably connected to a communications interface such that processing circuit 452 and the various components thereof can send and receive data via cloud 408. Processor 454 can be implemented as a general purpose processor, an application specific integrated circuit (ASIC), one or more field programmable gate arrays (FPGAs), a group of processing components, or other suitable electronic processing components.

Memory 456 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 456 can be or include volatile memory or non-volatile memory. Memory 456 can include database components, object code components, script components, or any other type of information structure for supporting the various activities and information structures described in the present application. According to an example embodiment, memory 456 is communicably connected to processor 454 via processing circuit 452 and includes computer code for executing (e.g., by processing circuit 452 and/or processor 454) one or more processes described herein. In some embodiments, server 450 is implemented within a single computer (e.g., one server, one housing, etc.). In various other embodiments server 450 can be distributed across multiple servers or computers (e.g., that can exist in distributed locations).

Thermostat Application

Referring generally to FIGS. 5-24, various examples of thermostat applications for thermostat 301 are shown, according to some embodiments. Thermostat displays as shown in FIGS. 5-24 may be displayed on a user interface of user device 402. With regards to the specification for FIGS. 5-24, all display elements can be assumed to appear on user device 402, but are limited to the elements disclosed herein. In various embodiments, user device 402 may provide a thermostat application to a user via a user interface. The user may control parameters of the control system (e.g., temperature setpoints) via the thermostat application.

Figure 5:
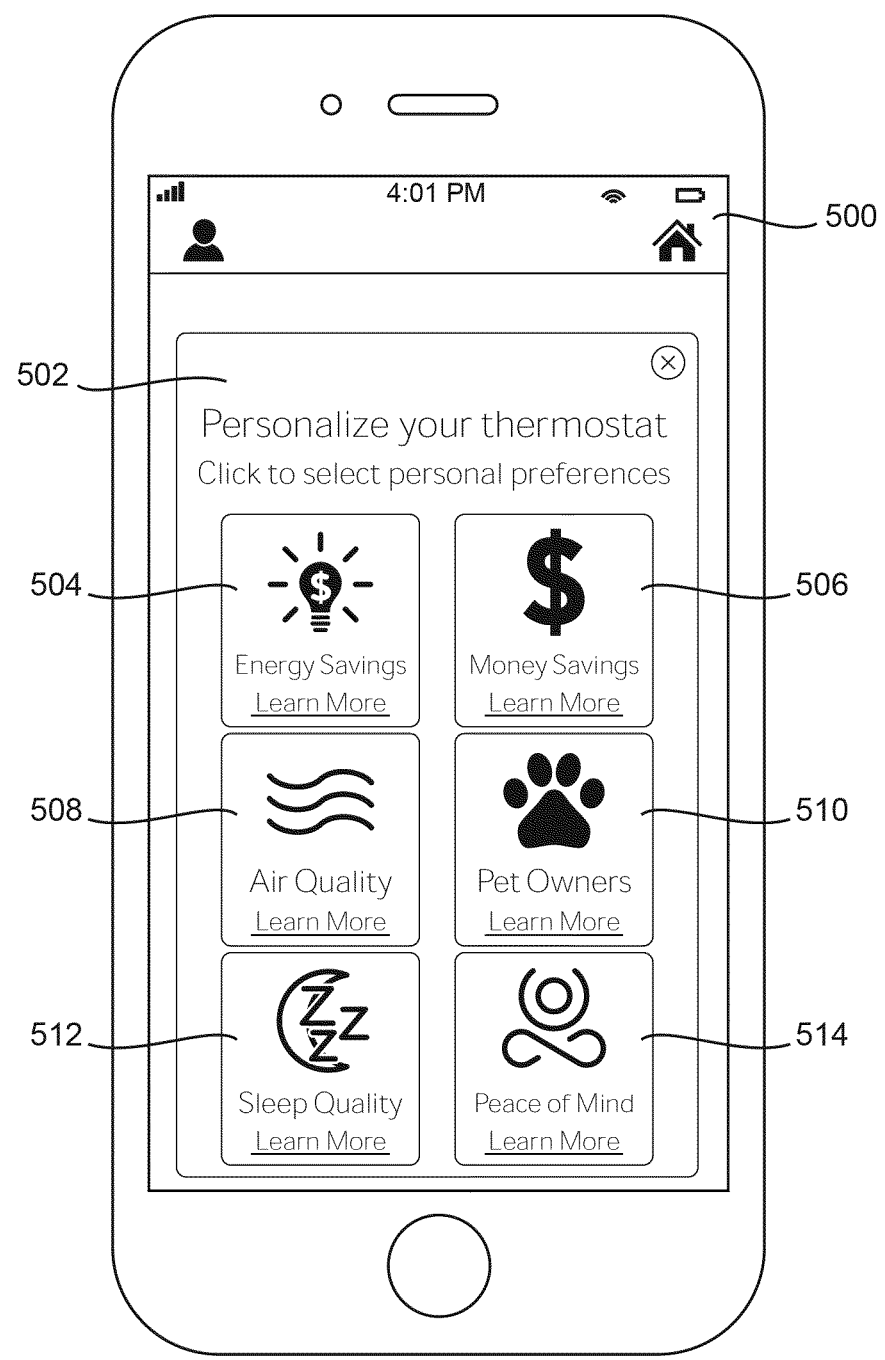
FIGS. 5-24 are drawings of an application for a thermostat display that can be used in the thermostat system of FIG. 4B, according to some embodiments.

Referring to FIGS. 5-12, embodiments of thermostat applications for thermostat 301 are shown. Referring to FIG. 5, an interface 500 is shown, according to an exemplary embodiment. Interface 500 may be any interface capable of displaying information relating to the HVAC systems in building 10. In some embodiments, interface 500 displays environmental information relating to a residential HVAC system (e.g., system 300) or commercial HVAC system, including temperature, humidity, and other environmental factors. Interface 500 may also include various widgets that allow a user to personalize the thermostat. For example, a user may interact with interface 500 via user device 402. The user may provide personalized information relating to HVAC controls, (e.g., on-off peak times, etc.) to processing within a cloud (e.g., cloud 408). In various embodiments, a user may provide a setpoint, preference, and/or instruction signals to an off-premises server located in a separate building, wherein processing of the signals is performed via a processing circuit in the server and transmission of the signals is provided/received via a cloud network. In some embodiments, this process may be referred to as implementing a cloud thermostat or "virtual" thermostat, as the processing for the thermostats is performed via a cloud network. Various processes for personalizing the virtual thermostat is shown in window 502 of interface 500.

Window 502 is shown to include widgets 504-514. Interface 500 may include several windows 502 or a single window 502. Window 502 may be configured to display various personalization features to a user. In some embodiments, interface 500 is not exclusively providing HVAC control instructions, and may provide preferences regarding energy savings, air quality, sleep quality, or other preferences. Window 502 is not limited to the widgets shown in FIG. 5 and may include more or less widgets.

Widget 504 is shown to be an energy savings widget. In some embodiments, a user may click on energy savings widget 504 (e.g., button) to engage in an energy savings process within a building. For example, when a user engages with energy savings widget 504, the interface will prompt a user to select one or more settings for saving energy. These may include implementing a demand response system, such that the purchase/usage of a utility (e.g., electricity) by the user or other customer is based on the demand changes for the utility. In other embodiments, these may include selecting a time-sensitive energy-savings system, during which usage of a utility (e.g., electricity) will be mitigated during certain hours of the day.

Figure 7:
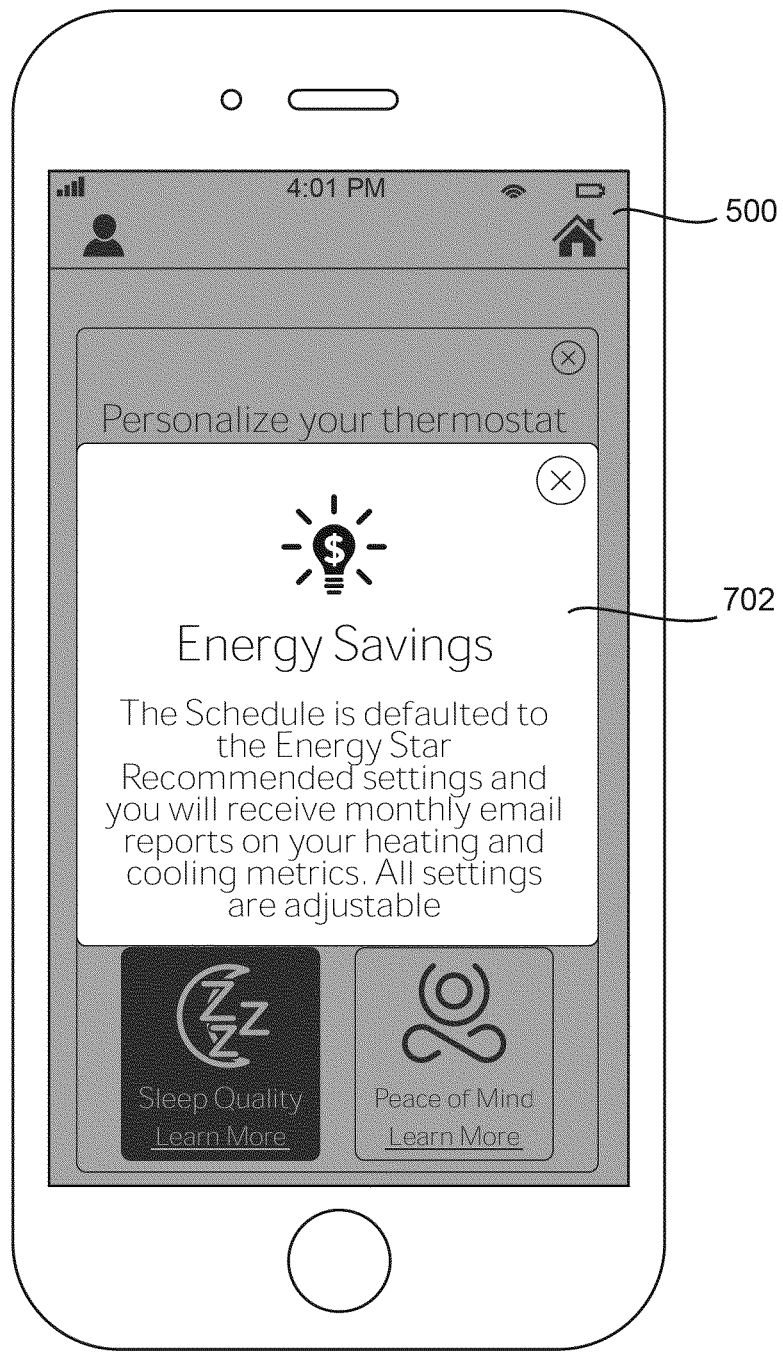

In some embodiments, energy savings widget 504 includes an information window 702, as shown in FIG. 7. Information window 702 states, "Energy Savings: The Schedule is defaulted to the Energy Star Recommended settings and you will receive monthly email reports on your heating and cooling metrics. All settings are adjustable." Information window 702 may be configured to display information relating to the functionality of energy savings widget 504. In some embodiments, the Energy Star Recommended settings refer to default settings established that optimize energy savings. These may include but are not limited to temperature setpoints at certain parts of the day or utility purchased at certain parts of the day. In some embodiments, information window 702 describes the various functionality and personalization of energy savings widget 504 to fit the energy savings preferences of a user.

Figure 8:
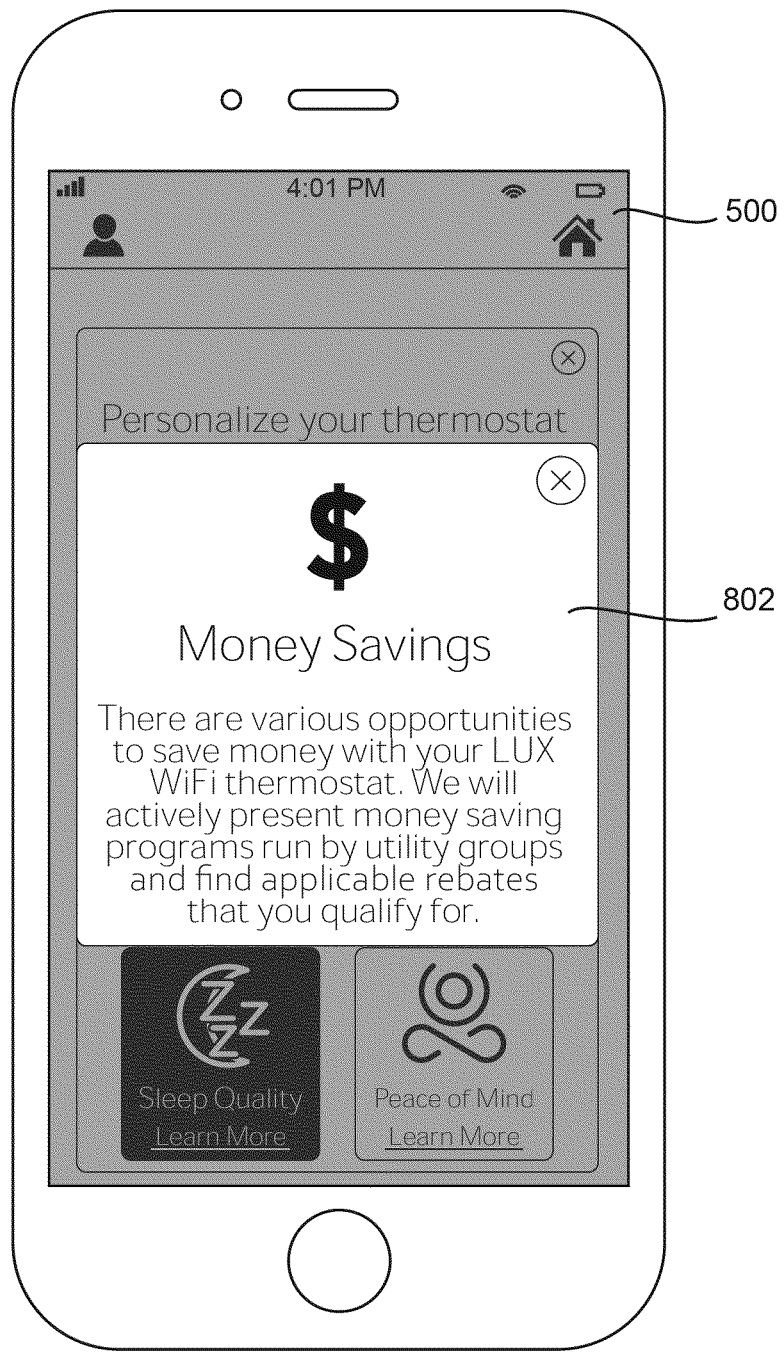

Referring back to FIG. 5, a widget 506 is configured to be a money savings widget. A user may select money savings widget 506 to display various methods of saving money on utility bills. For example, a user may be able to engage in a display mode that allows a user to see the peak/trough prices for various utilities (e.g., electricity, etc.). In some embodiments, money savings widget 506 includes an information window 802, as shown in FIG. 8. Information window 802 states, "Money Savings: There are various opportunities to save money with your LUX Wi-Fi thermostat. We will actively present money saving programs run by utility groups and find applicable rebates that you qualify for." In some embodiments, information window 802 describes the various functionality and personalization of energy savings widget 504 to fit the money savings preferences of a user. Money savings widget 506 may automatically provide real-time updates from utility groups and provide savings opportunities based on the updates. For example, interface 500 may be providing the visual application for the phone application (e.g., phone app, etc.) that is processed via cloud 408, as shown in FIG. 4. The application may receive real-time updates from utility providers (e.g., electricity providers), such as price per kW h, peak times, high-demand times, and other information. The application may process this information and determine a method for controlling HVAC system equipment 418 such that net payments towards operating system 400 will decrease over a period of time (e.g., a week, a month, a year, etc.).

Referring back to FIG. 5, widget 508 is shown to be an air quality widget. In some embodiments, a user wishes to improve or optimize the quality of air circulating throughout a residential home (e.g., within system 400). Engaging air quality widget 508 may allow a user to select from various filtering methods (e.g., UV filtering, filtering for CO2, etc.) or optimizing based on environmental conditions. For example, a user engages air quality widget 508 and selects an option that decreases the maximum amount of carbon dioxide (CO2) within the supply air to the residential home in which system 400 is located. In another example, the application receives real-time data on weather conditions in the area (e.g., region, town, neighborhood) of the residential home in which system 400 is located. The application may then forecast potential air quality based on the received weather information and provide the user with options for optimizing filtering. In this example, this could include the application determining that a heat wave is going to pass through the residential home in a week. The application determines that air pollutants may increase in the surrounding air as, during heat waves, the air becomes stagnant and traps emitted pollutants. The application may provide a setting to the user (e.g., via air quality widget 508) that allows the user to select a feature wherein the filtering will be optimized to account for the increase in air pollutants.

Figure 9:
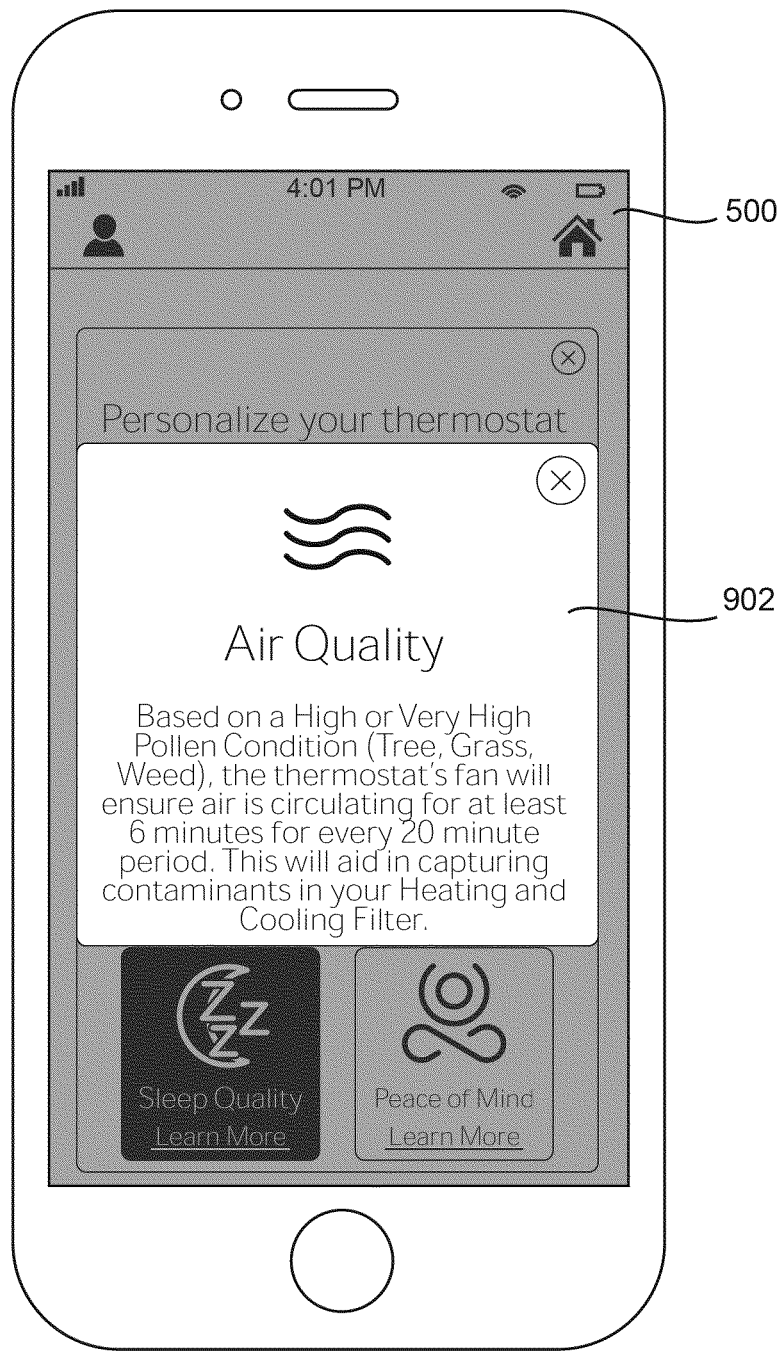

In some embodiments, air quality widget 508 includes an information window 902, as shown in FIG. 9. Information window 902 states, "Air Quality: Based on a High or Very High Pollen Condition (Tree, Grass, Weed), the thermostat's fan will ensure air is circulating for at least 6 minutes for every 20 minute period. This will aid in capturing contaminants in your Heating and Cooling Filter." In some embodiments, information window 902 describes the various functionality and personalization of energy savings widget 504 to fit the air quality preferences of a user.

Referring back to FIG. 5, a widget 510 is configured to be a pet owner's widget. In some embodiments, a user may be able to personalize the application to control a HVAC system around their pets' needs. Pet owners widget 510 may include temperature settings and air quality settings that are based around the animal's preferences. In some embodiments, the quality of air may be measureable in system 400 (e.g., able to measure particulates, CO2 levels, or other air pollutants). The air system may be configured to adjust filtering based on certain levels of the particulates in the air. Air quality widget 508 and pet owners widget 510 may work together to create a personalized air quality optimization for pets (e.g., animals, dogs, cats, etc.). Various processes for personalization related to pets is described in greater detail below with reference to FIG. 16.

Figure 10:
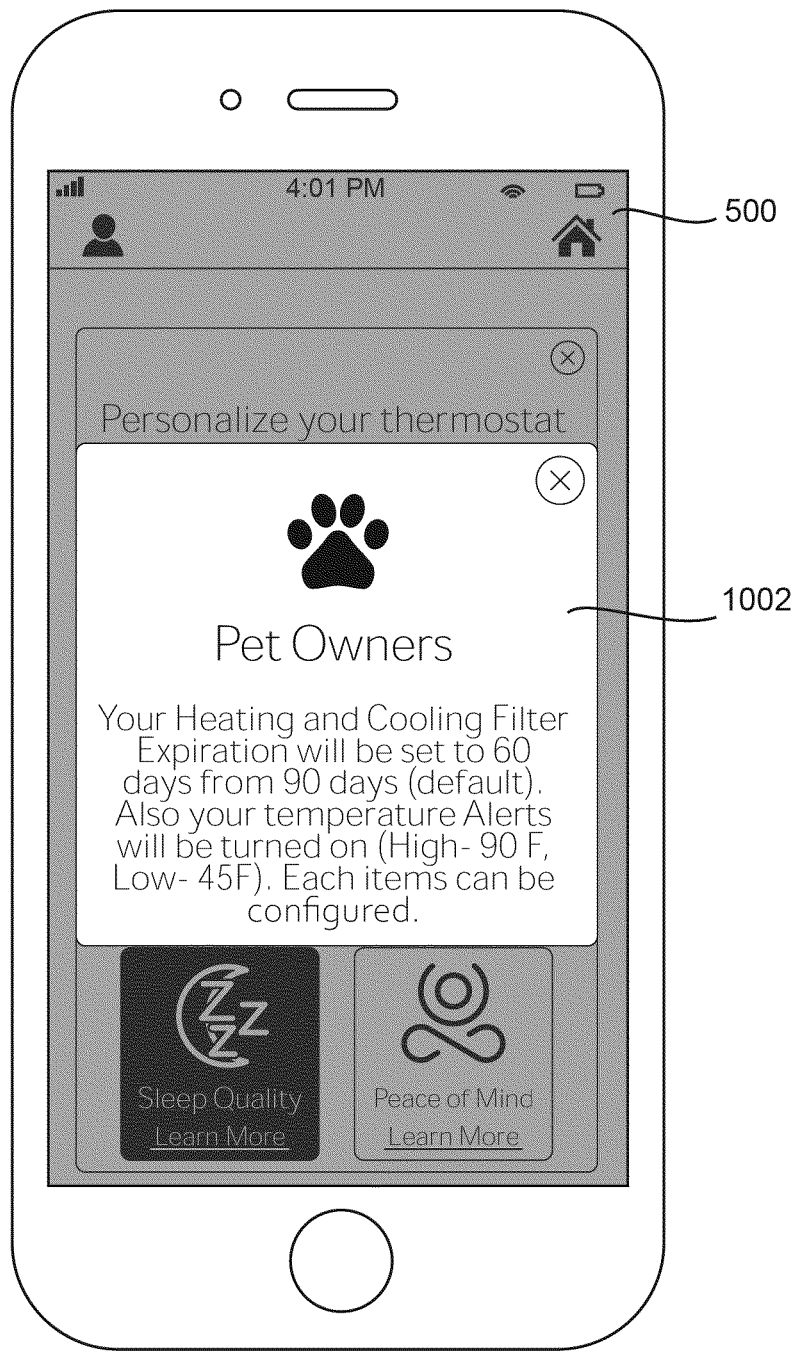

In some embodiments, pet owners widget 510 includes an information window 1002, as shown in FIG. 10. Information window 1002 states, "Pet Owners: Your Heating and Cooling Filter Expiration will be set to 60 days from 90 days (default). Also your temperature Alerts will be turned on (High—90 F, Low—45 F). Each item can be configured." Information windows described herein (e.g., window, 1002, etc.) may disclose information about the respective widgets that they display information for. In some embodiments, information window 1002 describes the various functionality and personalization of energy savings widget 504 to fit the pet preferences of a user Referring back to FIG. 5, a widget 512 may be configured to improve the sleep quality of a user within system 400. In some embodiments, a user may be able to monitor and change the temperature setpoints, and/or other HVAC control parameters during sleep hours. For example, if a user prefers a lower temperature during sleeping hours (e.g., 20° C., etc.) and a higher temperature during awake hours (e.g., 24° C., etc.), the application may allow a user to personalize the application for these preferences. Various other settings and/or parameters that may be personalized for a user's sleep preferences are described in greater detail below with reference to FIG. 17.

Figure 11:

In some embodiments, sleep quality widget 512 includes an information window 1102, as shown in FIG. 11. Information window 1102 states, "Sleep Quality: Temperature has a significant impact on your sleep quality and we set your nighttime period of your schedule to a temperature that follows standard guidelines. All settings are adjustable." In some embodiments, information window 1102 described what the functionality of sleep quality widget 512 is and how a user may interact with sleep quality widget 512 to personalize the application to fit the user's sleep preferences. Information window 1102 is not limited to the information disclosed in FIG. 11, and may include some or more information relating to the functionality, description, and/or personalization of sleep quality widget 512.

Referring back to FIG. 5, a widget 514 is shown to include peace of mind. Peace of mind widget 514 may be configured to provide predictive assistance for the operation and safety of system 400. In some embodiments, peace of mind widget 514 provides information to a user to inform the user of upcoming or potential issues within the HVAC system of which the thermostat is controlling (e.g., system 400). For example, the thermostat being monitored and/or controlled by the application (e.g., thermostat 412) is connected to a cloud (e.g., provides data to a cloud server to be processed). The cloud receives data from one or more air quality sensors measuring a particulate matter (e.g., dust, salt, etc.) at the supply duct into the building. Processing circuitry in the cloud may receive this data and determine, via modeling or other predictive processing, the degradation of the air filter within the air duct. The processing circuitry in the cloud may also provide information back to the user indicating the predicted lifetime of the air filter and a recommendation as to when the user should replace the filter.

In some embodiments, peace of mind widget 514 incorporates machine learning from server 450. Server 450 may receive historical data (e.g., operational data of system 400 over a period of time) and model system 400 such that deviations from typical operation may be observed. For example, server 450 may receive air quality data relating to system 400 that indicates that air filters in air ducts of system 400 tend to need replacing every 6 months. Accordingly, server 450 may begin to provide updates to the user (e.g., via user device 402) that indicate when the user should replace the filter. This may be provided via peace of mind widget 514. In some embodiments, peace of mind widget 514 is not limited to air quality data and can make predictions on various environmental parameters within system 400, including temperature predictions and installation predictions (e.g., installing new fans, motors, etc.).

Figure 12:
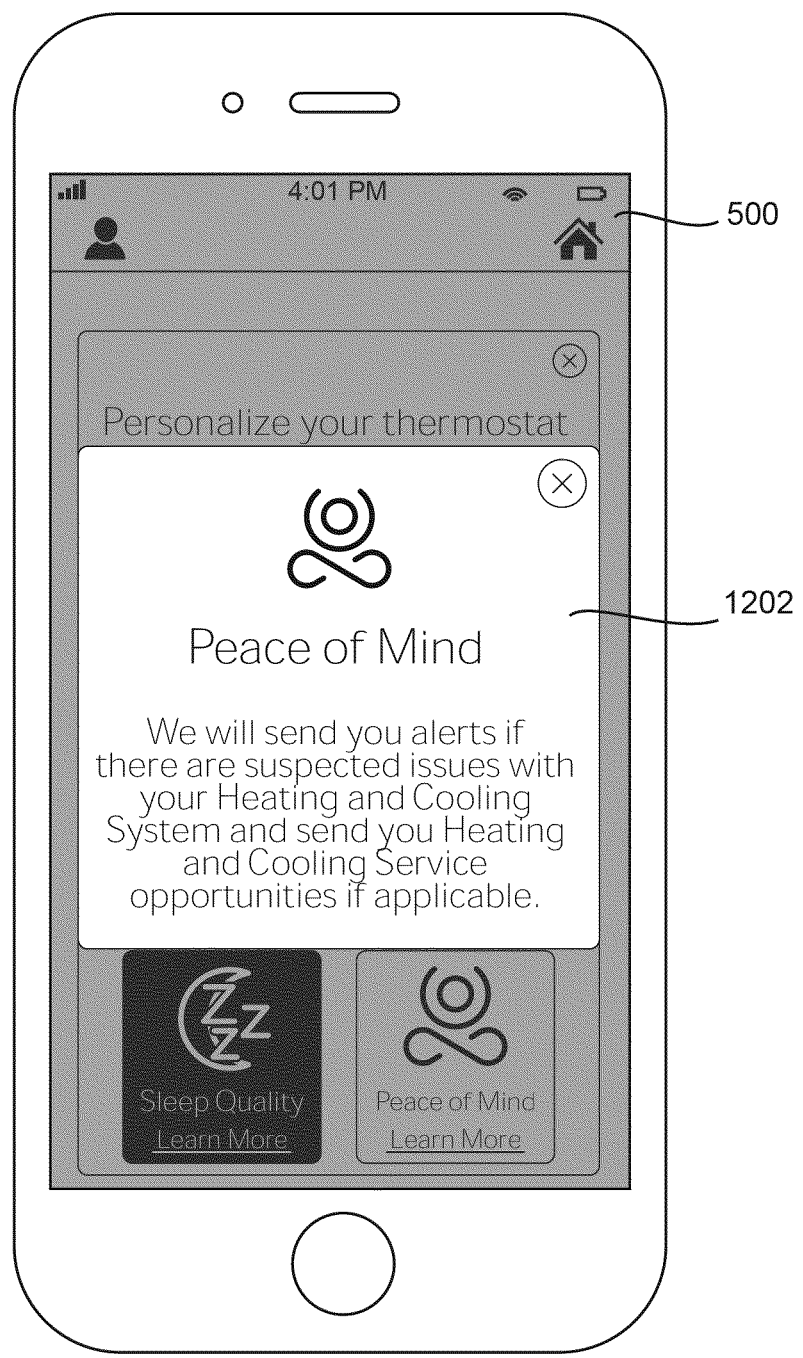

Peace of mind widget 514 is shown to include information window 1202, as shown in FIG. 12. Information window 1202 states, "Peace of Mind: We will send you alerts if there are suspected issues with your Heating and Cooling System and send you Heating and Cooling Service opportunities if applicable." In some embodiments, "alerts if there are suspected issues with your Heating and Cooling System" can include the application (e.g., via the cloud, via a cloud server, etc.) providing alerts to a user regarding potential issues within the HVAC system (e.g., system 400). In some embodiments, "send you Heating and Cooling Service opportunities if applicable" may include providing the user with various options for maintenance and/or repair of system 400. This may include the various maintenance settings and preferences as described below with reference to FIG. 18.

Figure 6:
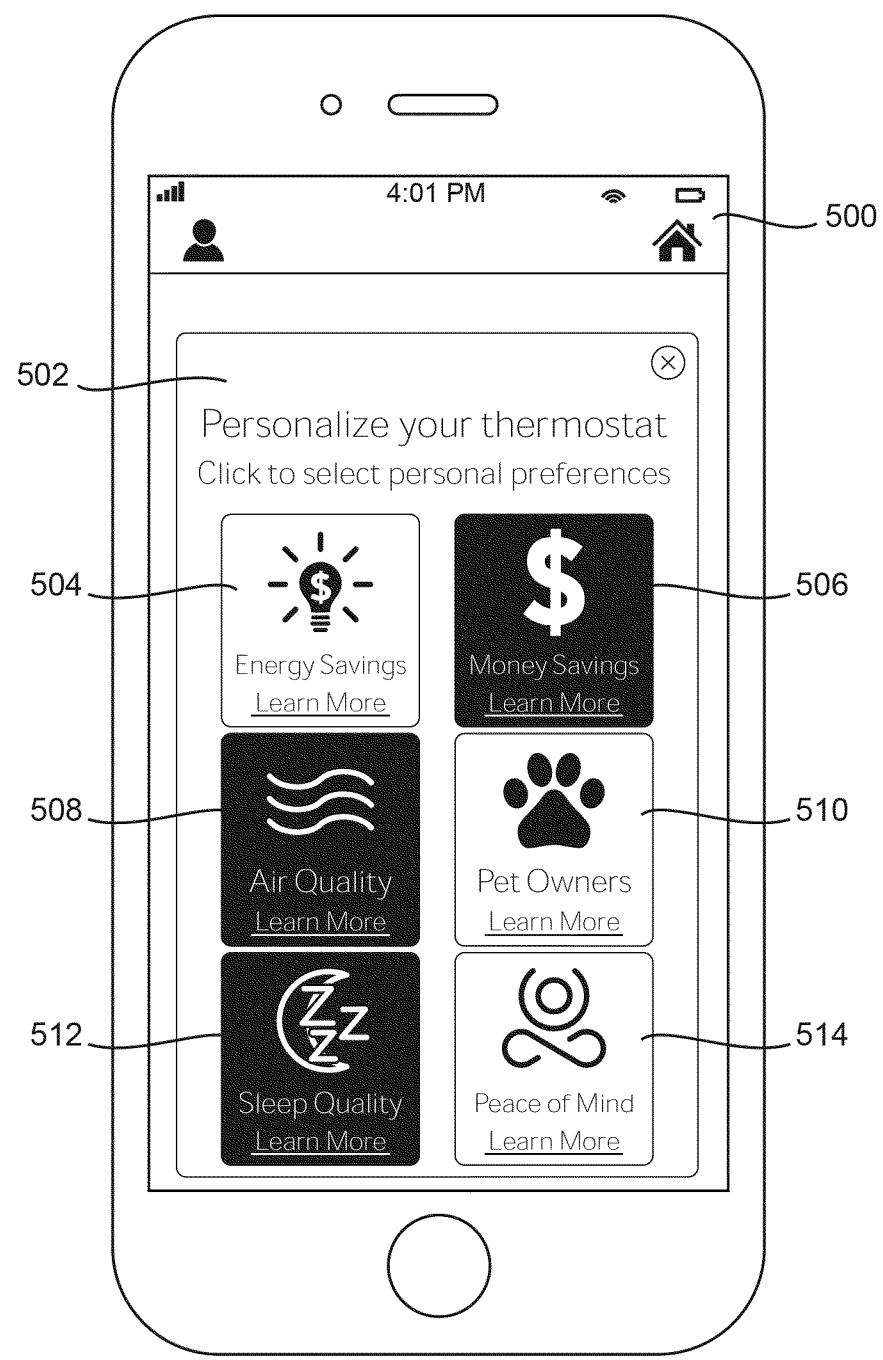

Referring now to FIG. 6, widgets 504-514 are shown to be selectable by a user. For example, a user may be able to "turn-on" (e.g., engage, etc.) one or more personalization widgets (e.g., money savings widget 506, air quality widget 508, and sleep quality widget 512) at the same time. This may engage the personalization features of all selected features concurrently. In the example as shown in FIG. 6, this may include various money savings preferences, air quality preferences, and sleep quality preferences engaging concurrently. In some embodiments, multiple widgets that are selected may have interfering preferences and/or control signals which will force the user to pick between the selected widgets.

Figure 13:
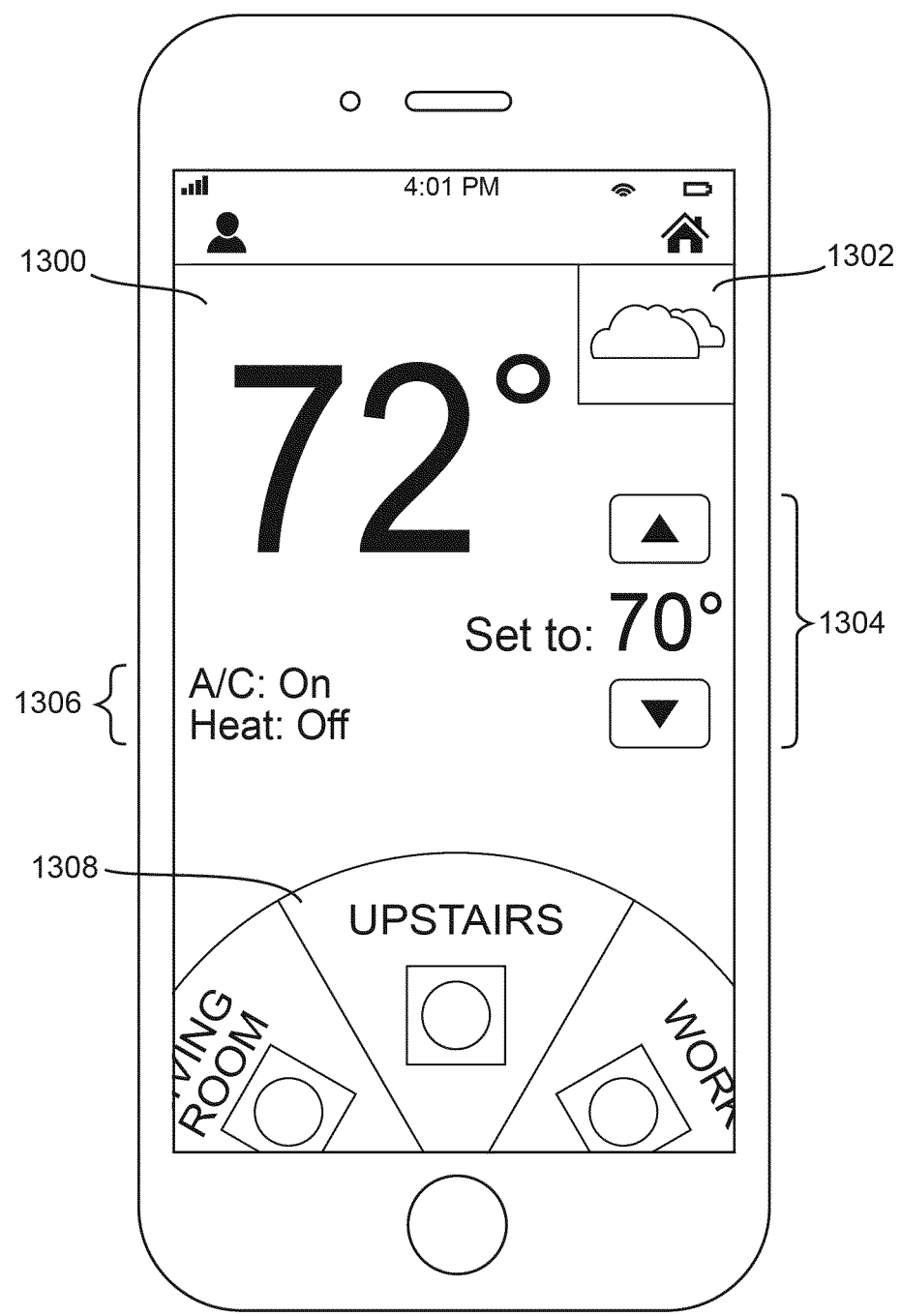
Figure 14:
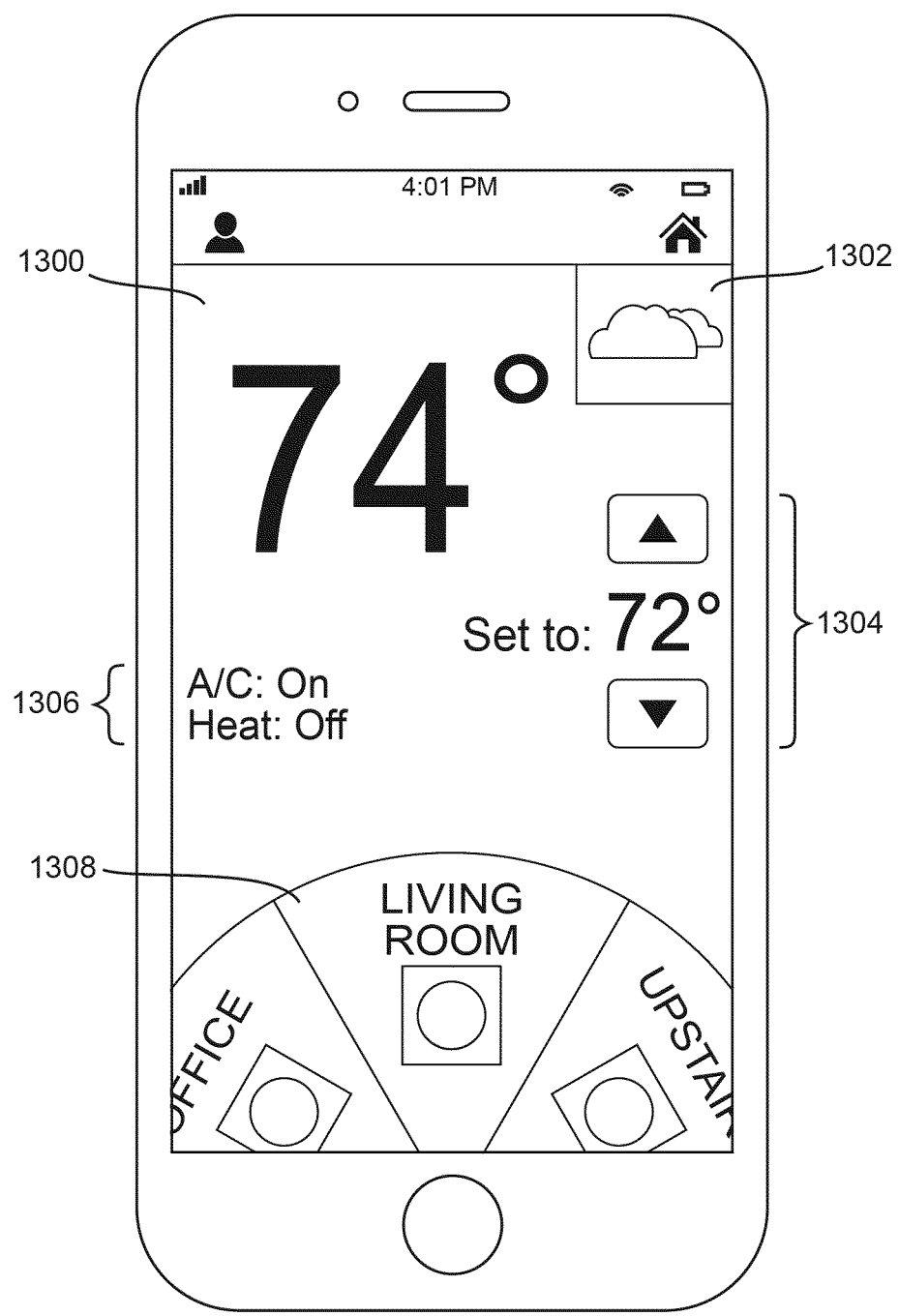
Figure 15:
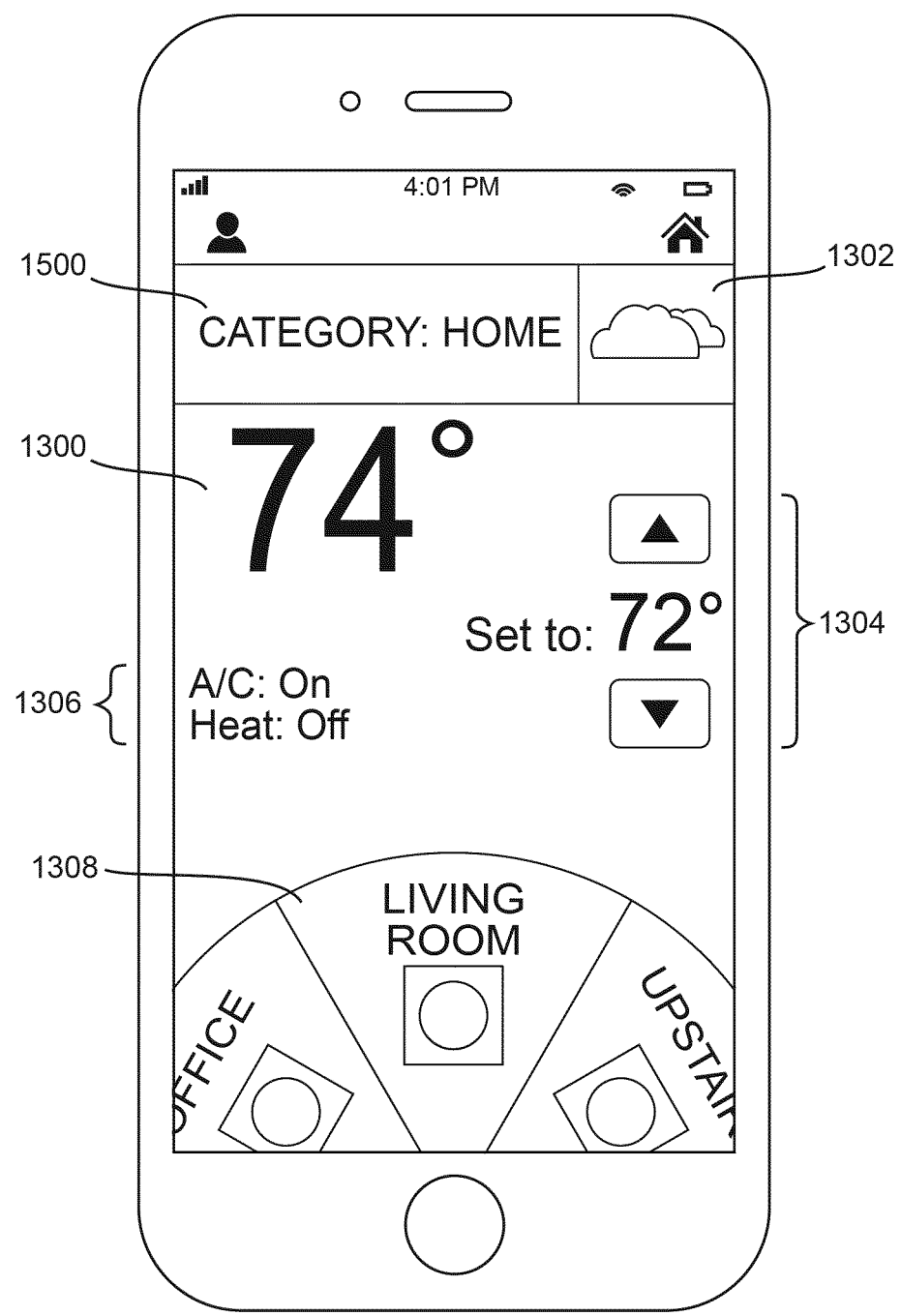

Referring now to FIGS. 13-15, user device 402 displays application on interface 500 that includes a temperature 1300, a weather indicator 1302, a temperature control 1304, a HVAC indicator 1306, and a selector widget 1308, according to exemplary embodiments. A user may scroll between various building zones (e.g., rooms within a residence) to observe various parameters regarding the temperate of the building zone. For example, in FIG. 13, user device 402 displays temperature 1300 as "72 degrees," weather indicator 1302 as a cloud icon, and HVAC indicator 1306 indicative of cooling (i.e., A/C "ON"). A user may scroll through various "rooms" by scrolling with selector widget 1308. In FIG. 14, a user scrolls from the "Upstairs" zone to the "Living Room" zone. In some embodiments, a user may scroll, swipe, or switch between pages of thermostats within a residence without going to a different menu for temperature controls.

Figure 16:
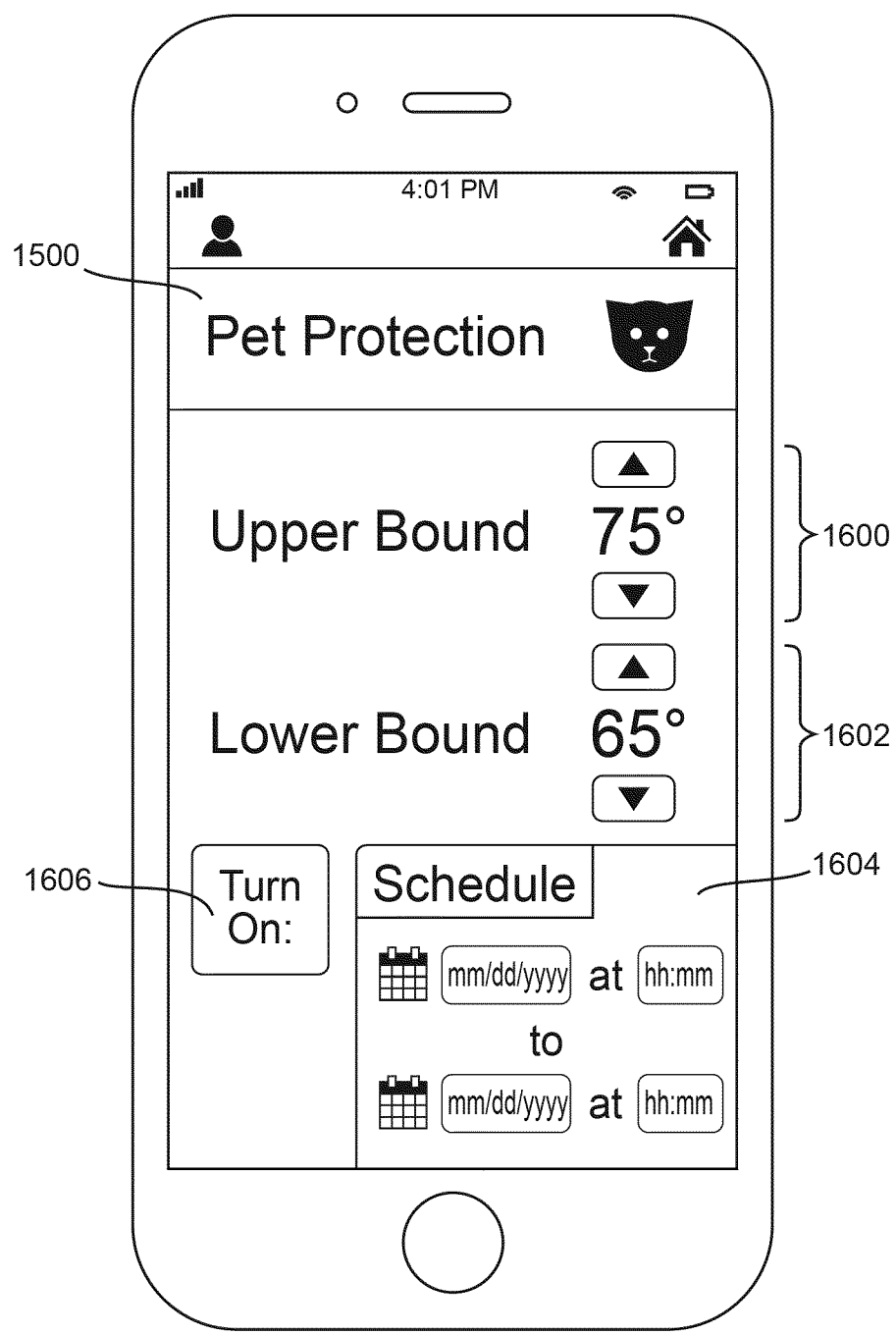

Referring now to FIGS. 16-19, various application settings and features of thermostat 301 are shown, according to exemplary embodiments. Referring to FIG. 16, setting 1500 is displayed on user device 402. Pet protection setting 1500 may allow the user to set temperature boundaries for thermostat 301 through user device 402. In some embodiments, pets and other vulnerable residents of a home (e.g., elderly residents) require a safe and comfortable temperature. As such, the user may established a low-bound and high-bound temperature setting by interacting with upper-bound widget 1600 and lower-bound widget 1602. Additionally, pet protection setting 1500 may include a turn-on widget 1606 that allows thermostat 301 to enter into a bounded-temperature mode during a specified time period. A scheduler widget 1604 may allow user device 402 to schedule a time period for thermostat 301 to provide control signals to building equipment (e.g., HVAC system equipment 418) such that the temperature within the building zone stays within the temperature bounds during the time period. In various embodiments, the bounding features of pet protection setting 1500 are not limited to protecting vulnerable residents and may be implemented/applied in various other settings.

Figure 17:
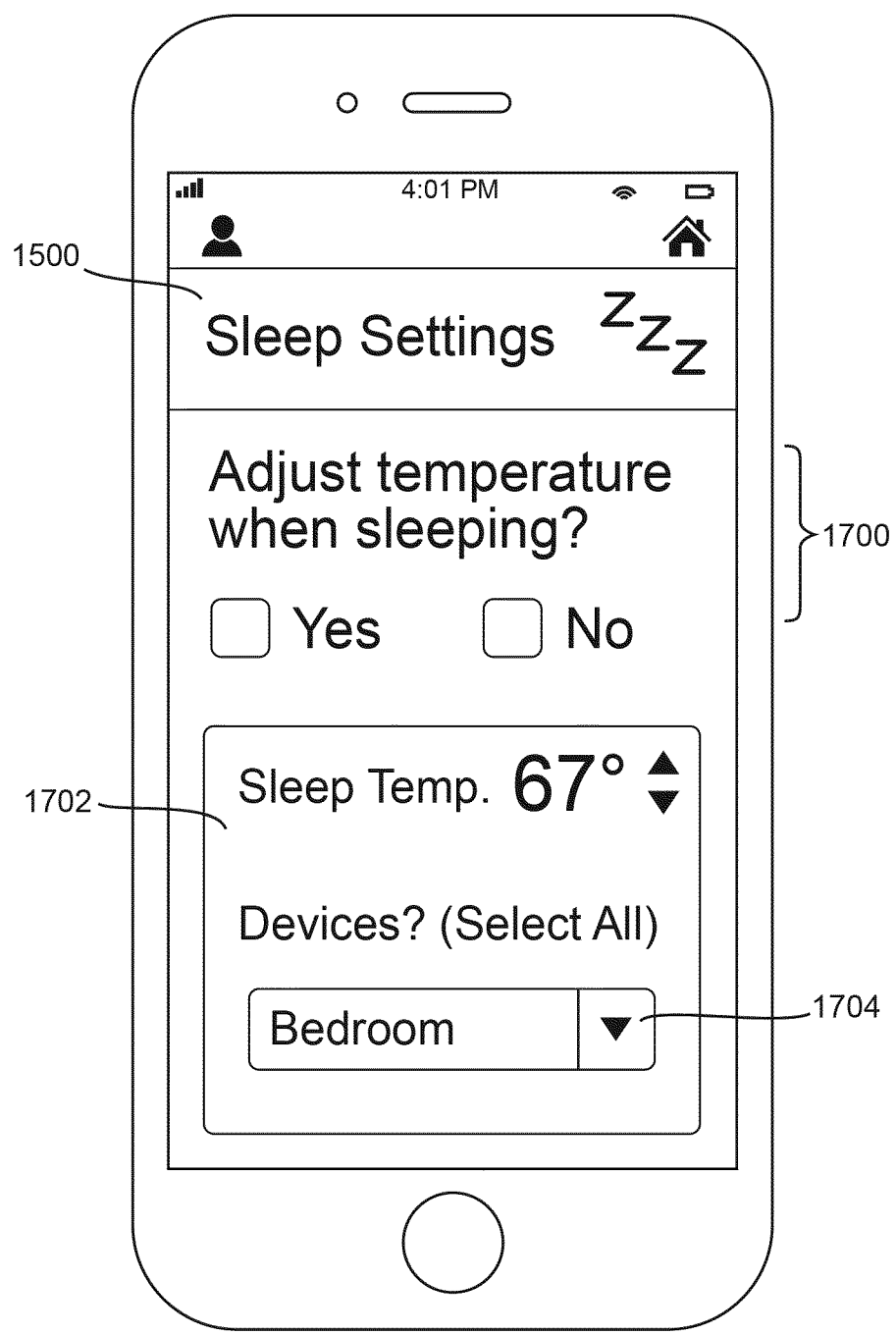

Referring to FIG. 17, a setting 1500 is shown to display "Sleep Settings," according to some embodiments. Sleep settings 1500 includes a temperature adjustment widget 1700, a sleeping temperature widget 1702, and a device widget 1704. Sleep settings 1500 may allow the user to interface with thermostat 301. In some embodiments, sleep settings 1500 allows the user to adjust temperature settings in a particular zone of a residence (e.g., bedroom, office, etc.) during sleeping hours. Sleeping temperature widget 1700 may be adjusted by the user to increase comfortability during sleeping hours. Sleeping temperature widget 1700 may further include a selection widget for determining whether to engage sleep settings 1500, as shown in FIG. 17.

Figure 18:
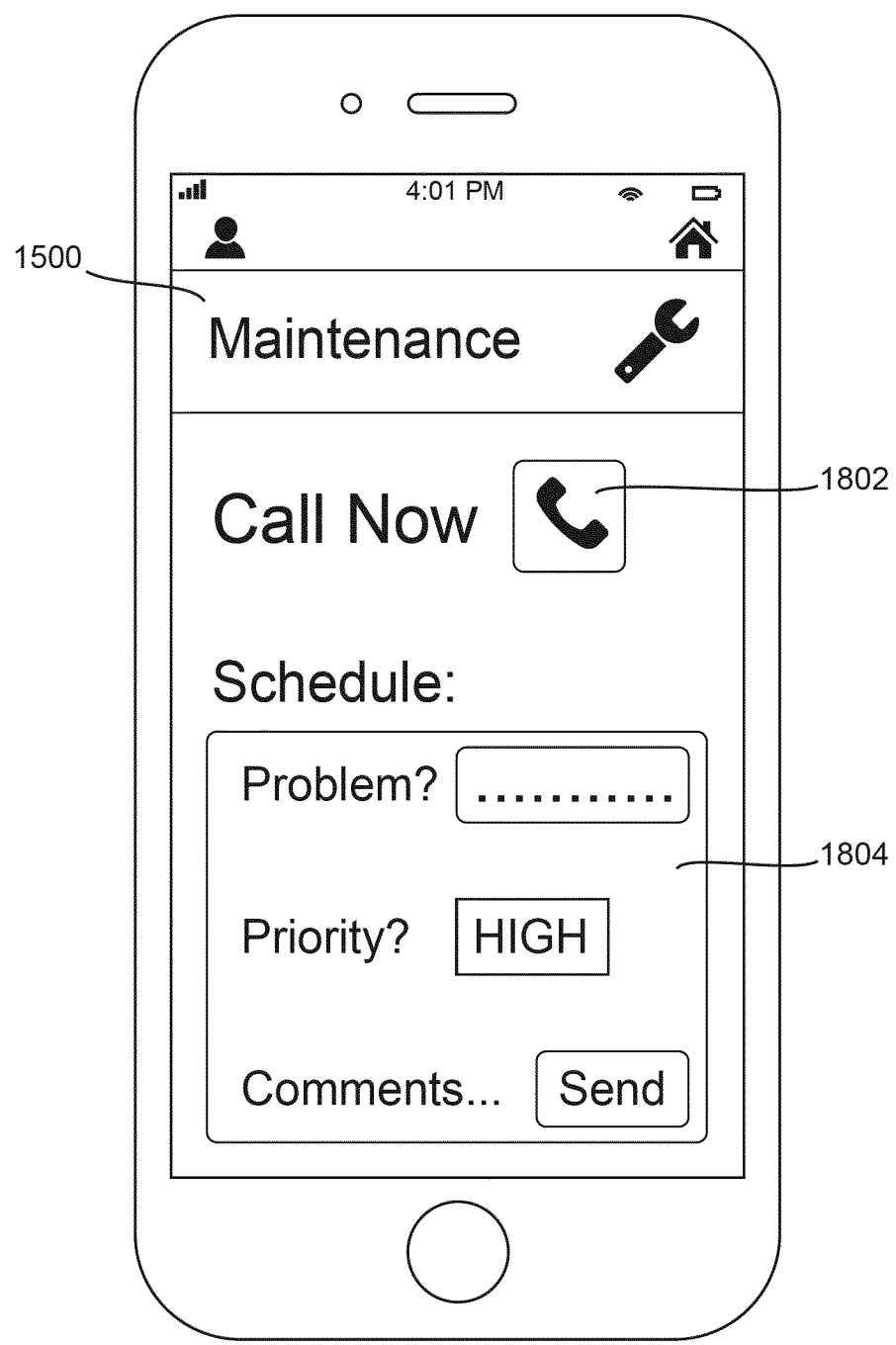

Referring to FIG. 18, setting 1500 is shown to display "Maintenance," according to exemplary embodiments. Maintenance setting 1500 may allow the user to update, provision, configure, or monitor parts and features of thermostat 301 via a thermostat application. Maintenance setting 1500 is shown to include a call widget 1802 and a scheduling widget 1804. In some embodiments, the user may require maintenance performed on the thermostat within their residence (e.g., thermostat 301). The user may then call the maintenance operator directly from the thermostat application, via call widget 1802. If the user wishes to schedule a maintenance appointment, they may then interface with scheduling widget 1804 to schedule an appointment at a specified time and date.

Figure 19:
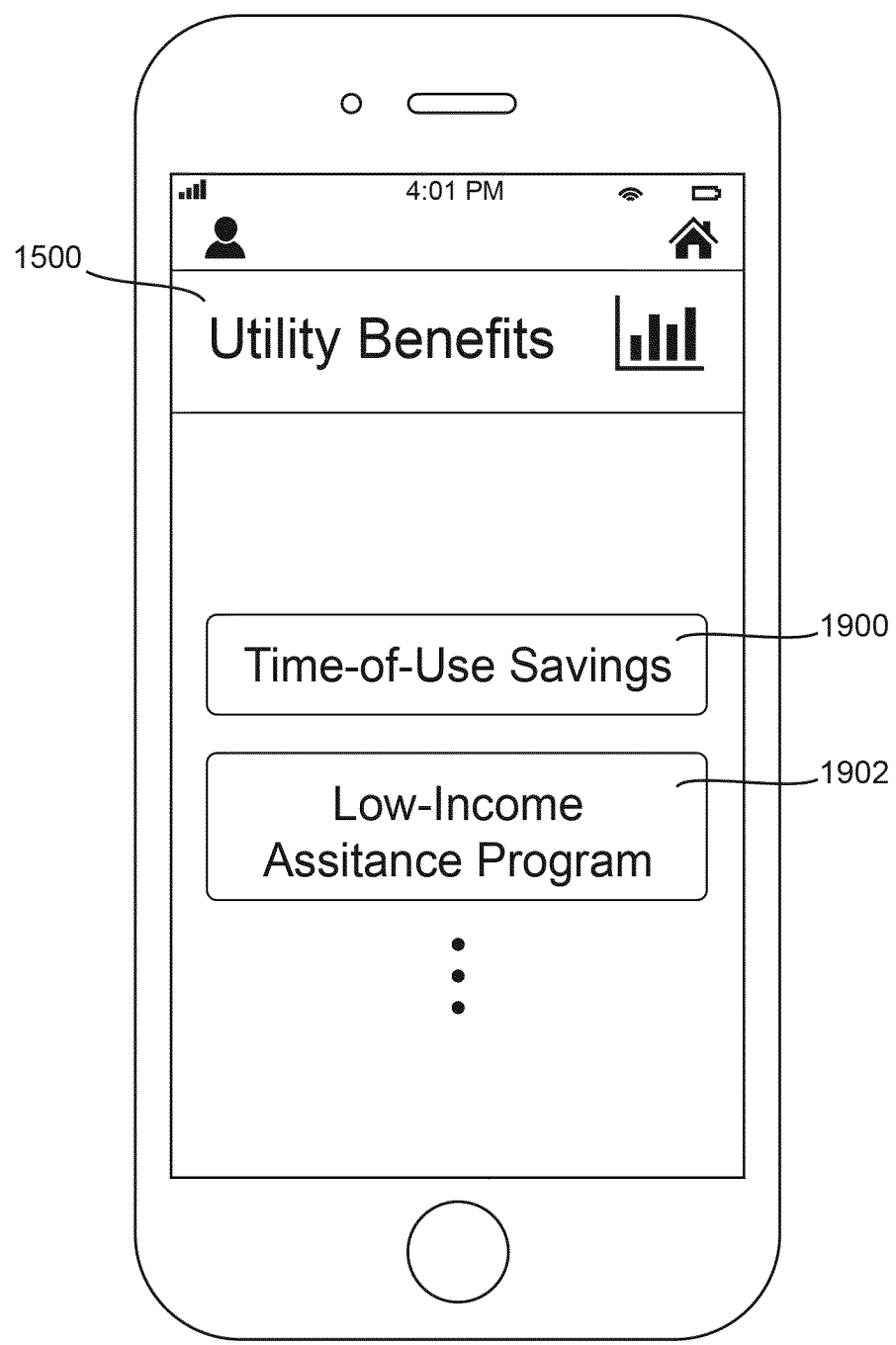

Referring to FIG. 19, a setting 1500 is shown to display "Utility Benefits," according to exemplary embodiments. Utility benefits setting 1500 may provide various features, promotional benefits, and other information from a utility company (e.g., utility provider 406) to a user via the thermostat application. This may allow the user to see various benefits from controlling the temperature in his/her residence in a particular way. For example, the user may receive a promotional offer such that the energy prices for their electrical utility is at a discounted price at certain times of the day. Utility benefits setting 1500 may include a time-of-use savings widget 1900 that, when selected, allows thermostat 301 to adjust temperatures within the residence based on the promotional offer, as shown in FIG. 19. Utility benefits setting 1500 is further shown to include a low-income assistance program widget 1902. Low income assistance program widget 1902 may allow the user to opt into programs directed to utility users with low income. In some embodiments, information received from utility providers is updated on a recurring basis (e.g., daily, weekly, monthly, etc.). Accordingly, the thermostat application displayed on user device 402 may be updated on a recurring basis with new various features, promotional benefits, and other information from the utility company. In some embodiments, the thermostat application may include geo-location features that allow the user to identify utility providers via user device 402. Geo-location, as described herein, may refer to the identification or estimation of the real-world geographic location of an object, such as a radar source, mobile phone, or internet-connected computer terminal. In various embodiments, geo-location may refer to the latitude and longitude coordinates of a particular location.

Figure 20:
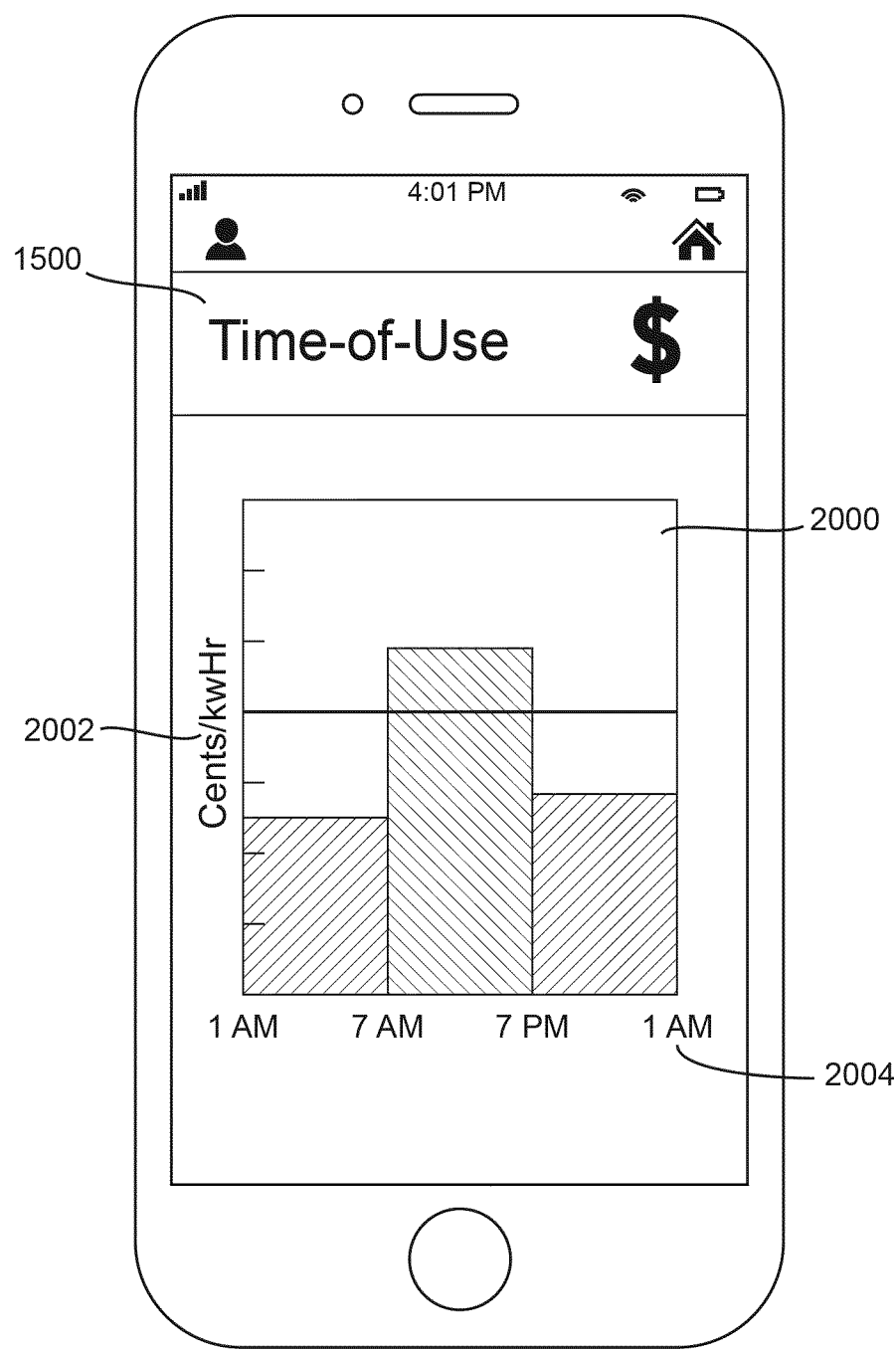

Referring to FIG. 20, a setting 1500 is shown to display "Time-of-Use," according to some embodiments. Time-of-use setting 1500 is shown to include a centers/kW h axis 2002 and a time axis 2004. In some embodiments, the price for the utility (e.g. electricity) will be lower at certain times of the day. The thermostat application displayed on user device 402 may display this information to the user, as shown in FIG. 20.

Figure 21:
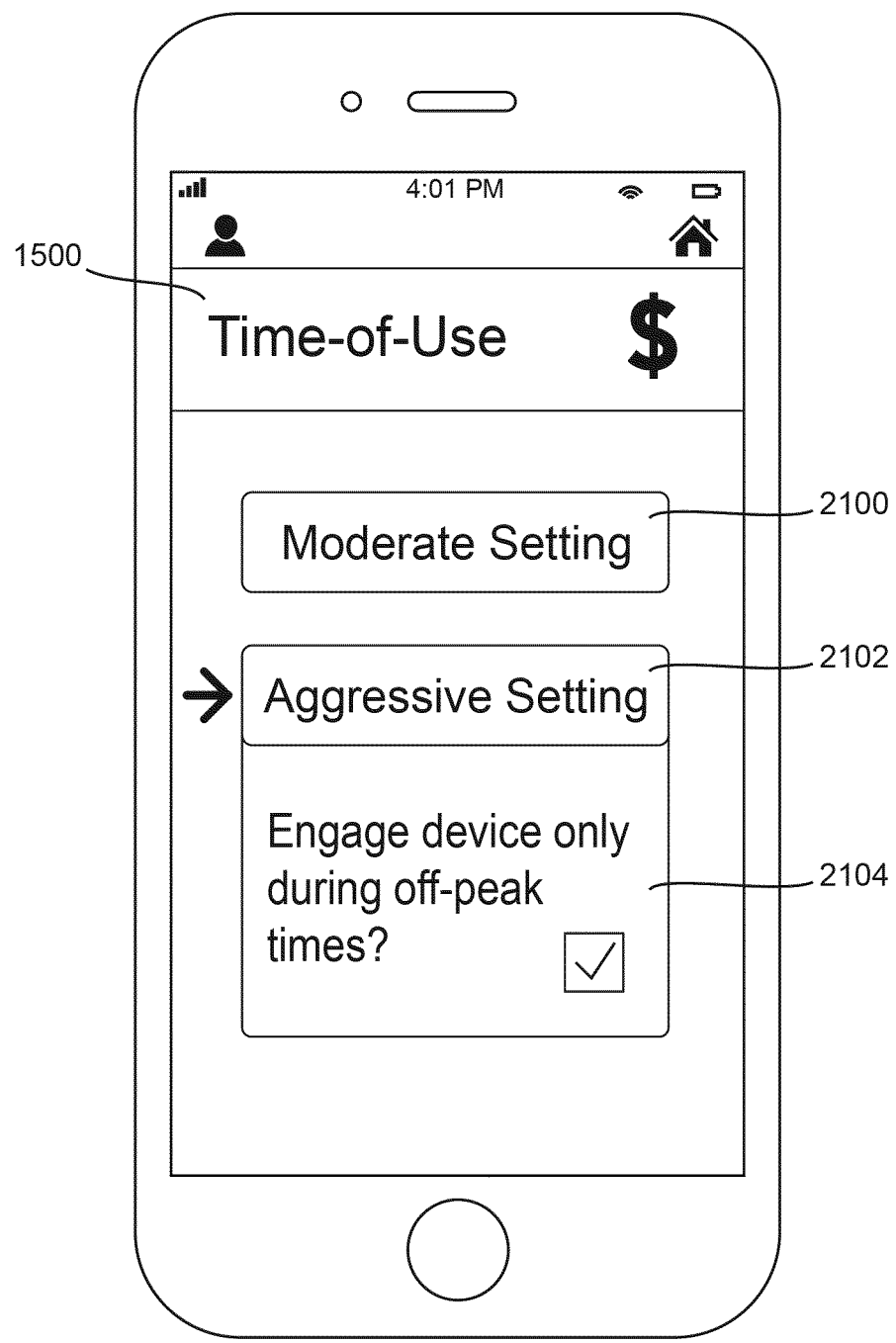

Referring to FIG. 21, a setting 1500 is shown to display "Time-of-Use," according to some embodiments. In some embodiments, FIG. 21 is another exemplary embodiment of the time-of-use setting 1500 as described in FIG. 20. Time-of-use setting 1500 is shown to include a moderate setting widget 2100 and an aggressive setting widget 2102. In some embodiments, the user may want to moderately save money by implementing "time-of-use" techniques. For example, if energy saving are greatest during early morning weekdays, the user may operate some electrical appliances during early morning weekdays. Conversely, the user may want to aggressively save money by implementing "time-of-use" techniques. For example, if energy saving are greatest during early morning weekdays, the user may operate most or all electrical appliances during early morning weekdays. Aggressive setting widget 2102 is shown to include a window 2104 which may prompt the user to verify they are entering into an aggressive savings mode.

Figure 22:
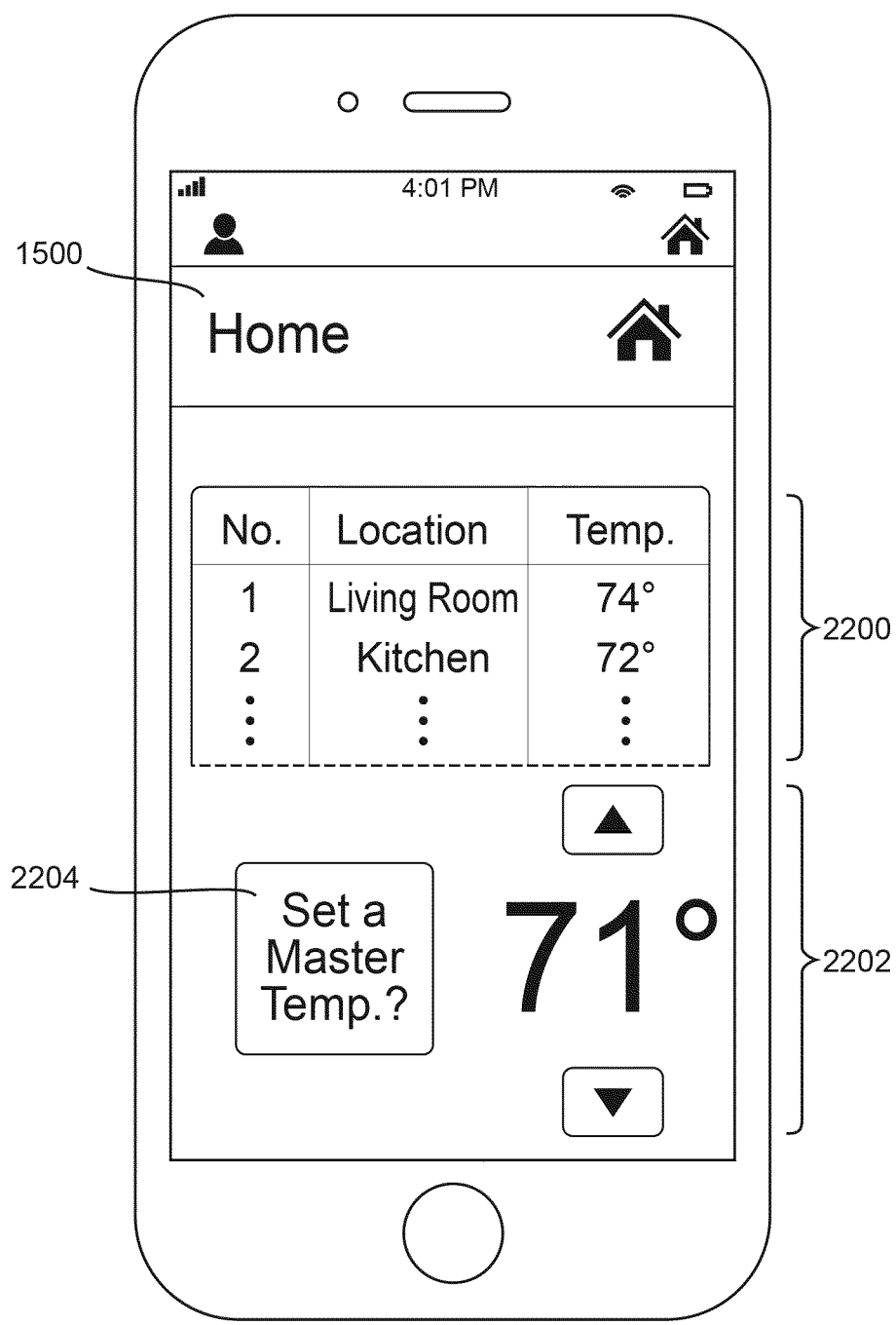
Figure 23:
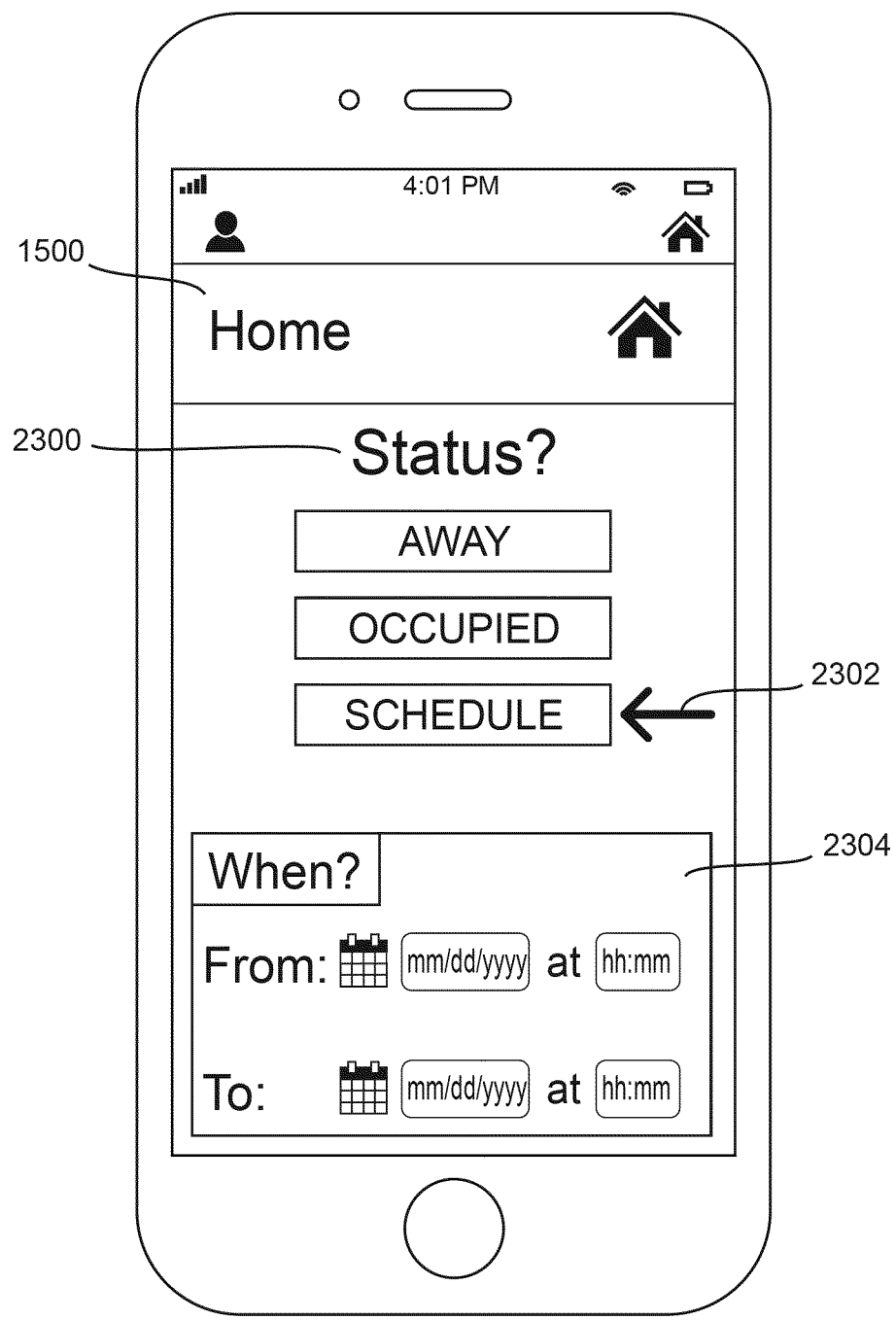
Figure 24:
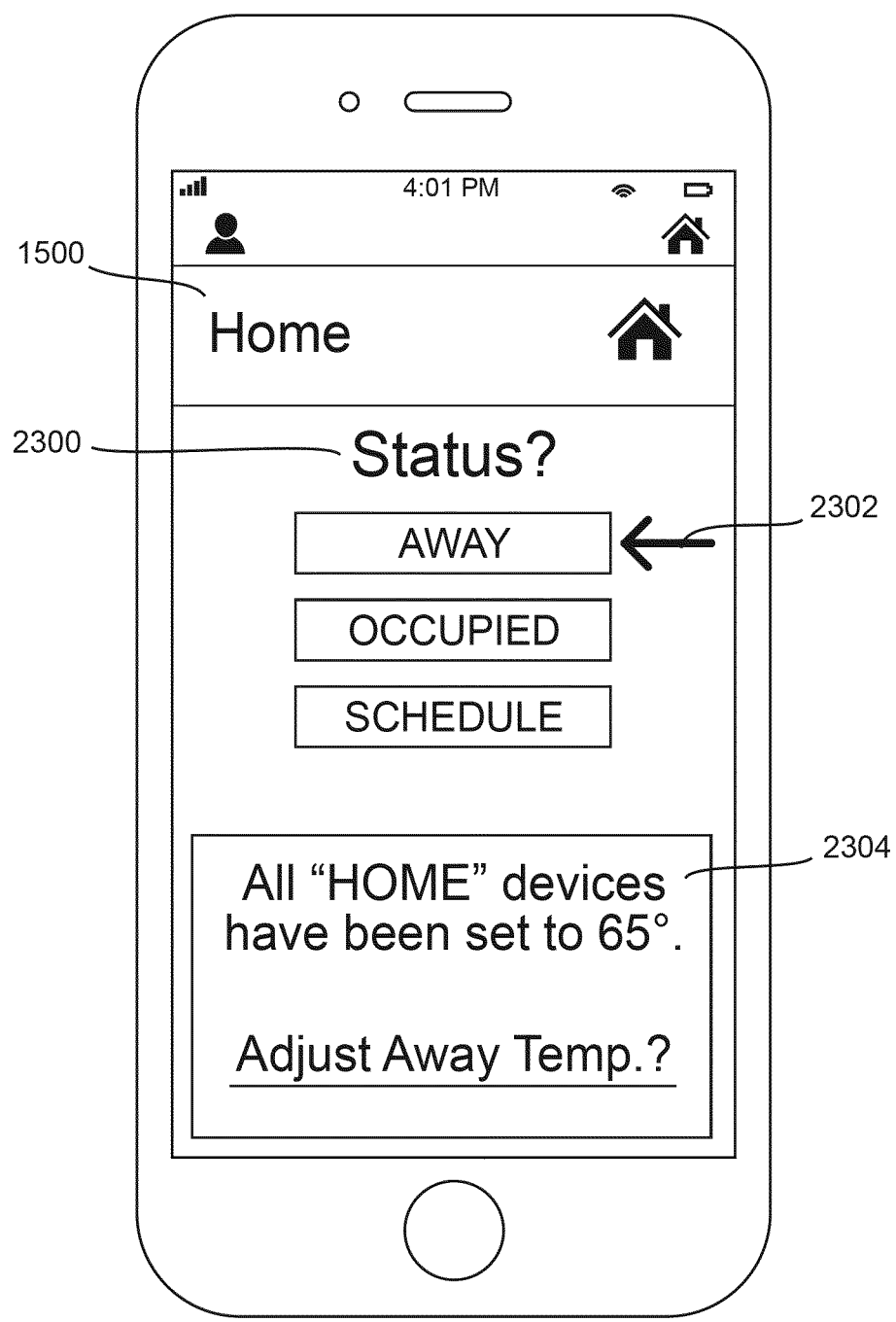

Referring now to FIGS. 22-24, various embodiments of establishing a master temperature for the various temperature setpoints within a residence are shown, according to exemplary embodiments. Referring to FIG. 22, a setting 1500 displays "Home," according to some embodiments. Home setting 1500 is shown to include a setpoint table 2200, a temperature widget 2202, and a master temperature selector 2204. In some embodiments, the user may want to configure all temperature setpoints inside of his/her residence to equal a single value. Accordingly, the user may engage master temperature selector 2204. The user may then adjust the master temperature by interfacing with temperature widget 2202.

Referring now to FIG. 23, a home setting 1500 is shown to include a status widget 2300, a selector 2302, and a schedule widget 2304. The user may schedule temperature settings based on the occupancy of the residency. For example, the temperature setpoint for a residence in which thermostat 301 is located may be at 72 degrees when the residence is occupied. However, the temperature setpoint for the residence in which thermostat 301 is located may be at 67 degrees when the residence is vacant. The user may schedule the temperature settings by selecting one of the various occupancy settings in status widget 2300 using selector 2302 and scheduling the time and day for the temperature setting by interfacing with scheduling widget 2304. Referring to FIG. 24, an exemplary embodiment of the user selecting an "AWAY" status for Home setting 1500 is shown. Scheduling widget 2304 prompts the user to adjust the temperature for the one or more temperature setpoints for thermostat 301. In some embodiments, thermostat 301 controls more than one temperature setpoint within a residence. In other embodiments, one thermostat 301 controls a single temperature setpoint, and the residence may include several thermostats 300.

Thermostat Processes

Figure 25:
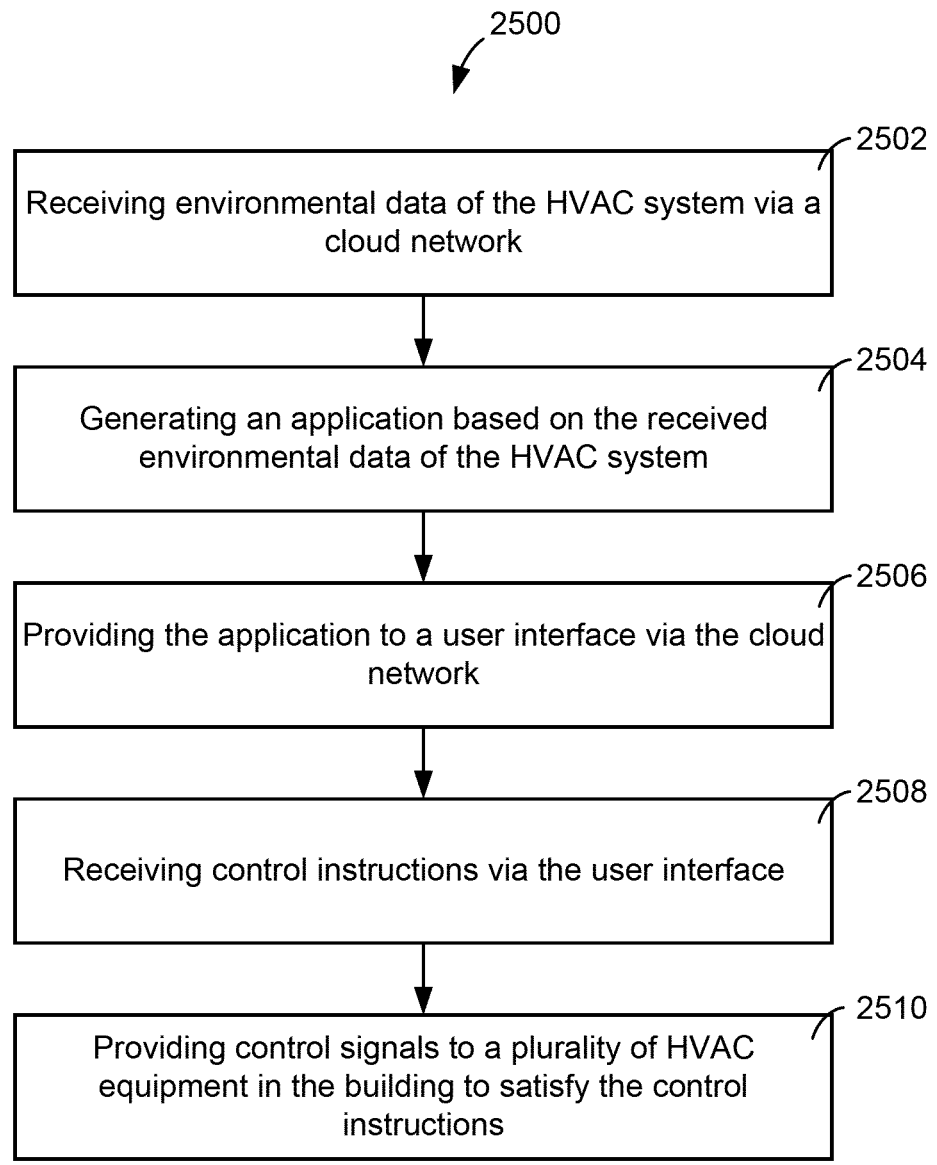
FIG. 25 is a flow diagram of a process for personalizing an HVAC system which can be used in the thermostat system of FIG. 4B, according to some embodiments.

Referring now to FIG. 25, a process 2500 for personalizing a HVAC control system in a building is shown, according to an exemplary embodiment. Process 2500 may be performed by server 450 as shown in FIG. 4B.

Process 2500 is shown to include receiving environmental data of the HVAC system via a cloud network (step 2502). Server 450 may receive data via cloud 408. The environmental data may include data via remote servers 404, including temperature data, air data (e.g., measurements of air particulate matter (PM), carbon dioxide levels, etc.), humidity data, etc.). In some embodiments, remote sensors 404 automatically measure environmental data of system 400 and provide the data to server 450 for processing and/or storing.

Process 2500 is shown to include generating an application based on the received environmental data of the HVAC system (step 2504) and providing the application to a user interface via the cloud network (step 2506). In some embodiments, server 450 generates an application that may or may not be based on the received environmental data. The application may be provided to a user via cloud 408 to user device 402, but the processing and storing of the application are maintained in server 450 off premise. Advantageously, this allows user device 402 to receive the application without needing to store the application on user device 402.

Process 2500 is shown to include receiving control instructions via the user interface (step 2508) and providing control signals to a plurality of HVAC equipment in the building to satisfy the control instructions (step 2510). Users (e.g., via user device 402) may provide instructions, preferences, and/or personalization requests to the application. The application may then provide this data back to server 450 via cloud 408 for processing. Server 450 may then be configured to provide control signals to HVAC system equipment 418 based on the instructions from user device 402.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for controlling a heating, ventilation, or air conditioning (HVAC) system in a building, the method comprising:
    receiving environmental data of the HVAC system via a cloud network;
    generating an application based on the received environmental data of the HVAC system;
    generating a model based on the received environmental data; and
    providing the application to a user interface via the cloud network, wherein the application is configured to:
        provide a user with a plurality of personalization widgets via the user interface, wherein the plurality of personalization widgets are generated based on the model;
        receive control instructions based on a selection of a first widget and a second widget of the plurality of personalization widgets via the user interface, wherein the first widget and the second widget are associated with different control strategies; and
        provide control signals to a plurality of HVAC equipment in the building to concurrently provide the different control strategies;
        prompt the user to unselect the first widget or the second widget in response to an interference between the different control strategies; and
        provide an additional widget configured to determine a set of recommendations based on the received environmental data and provide the set of recommendations to the user interface.

2. The method of claim 1, wherein generating the application is performed by one or more servers via a processing circuit, the processing circuit including one or more processors and memory, the one or more servers remote from the user interface.

3. The method of claim 1, wherein the first widget is a sleep quality widget and wherein the application is configured to concurrently provide the different control strategies by:
    receiving a sleep preference of the user via the user interface;
    determining a first set of control signals for the plurality of HVAC equipment based on the sleep preference of the user; and
    providing the first set of control signals to the plurality of HVAC equipment.

4. The method of claim 3, wherein the second widget is an energy or cost savings widget, and wherein the application is configured to concurrently provide the different control strategies by:
    receiving utility data via a utility provider;
    determining a second set of control signals based on the received utility data by executing a control process configured to reduce energy consumption or utility costs; and
    provide the second set of control signals to the plurality of HVAC equipment.

5. The method of claim 3, wherein the second widget is a pet widget, and wherein the application is configured to concurrently provide the different control strategies by:
    receiving a set of pet preferences via the user interface;
    determining a second set of control signals for the plurality of HVAC equipment based on the set of pet preferences and by; and
    providing the second set of control signals to the plurality of HVAC equipment.

6. The method of claim 1, wherein the first widget is an air quality widget and the second widget is a savings widget, wherein the application is configured to concurrently provide the different control strategies by:
    determining a first set of control signals by optimizing filtration by the HVAC system;
    determining a second set of control signals by executing a demand response step based on data from a utility provider; and
    providing the first and second sets of control signals to the plurality of HVAC equipment.

7. A system for personalizing heating, ventilation, or air conditioning (HVAC) controls in a building, the system comprising:
    HVAC equipment;
    a user device; and
    a cloud server comprising a processing circuit, the processing circuit comprising one or more processors and memory storing instructions that, when executed by the one or more processors, cause the one or more processors to perform operations comprising:
        receiving environmental data via a cloud network;
        generating an application based on the received environmental data; and
        providing the application to a user interface via the cloud network, wherein the application is configured to:
            provide a user with a plurality of personalization widgets via the user interface; and
            receive a selection of a first widget and a second widget of the plurality of personalization widgets via the user interface, the first widget and the second widget associated with different control strategies, wherein the first widget corresponds to an air quality improvement control strategy and the second widget corresponds to a cost or energy savings control strategy;

providing control signals to the HVAC equipment in the building by executing the different control strategies concurrently; and prompting, via the application, the user to unselect the first widget or the second widget in response to an interference between the different control strategies.

8. A system for personalizing heating, ventilation, or air conditioning (HVAC) controls in a building, the system comprising:

HVAC equipment a user device; and a cloud server comprising a processing circuit, the processing circuit comprising one or more processors and memory storing instructions that, when executed by the one or more processors, cause the one or more processors to perform operations comprising:

receiving environmental data via a cloud network;

generating an application based on the received environmental data; and providing the application to a user interface via the cloud network, wherein the application is configured to:

provide a user with a plurality of personalization widgets via the user interface; and receive a selection of a first widget and a second widget of the plurality of personalization widgets via the user interface, the first widget and the second widget associated with different control strategies;

providing control signals to the HVAC equipment in the building by executing the different control strategies concurrently; and prompting, via the application, the user to unselect the first widget or the second widget in response to an interference between the different control strategies wherein the first widget is a sleep widget configured to receive a set of sleep preferences of the user of the user interface; and wherein executing the different control strategies comprises determining a first set of control signals based on the set of sleep preferences of the user and providing the first set of control signals to the HVAC equipment.

9. The system of claim 8, wherein:

the second widget is a cost savings widget; and executing the different control strategies comprises determining a second set of control signals to provide demand response based on data from a utility provider and providing the second set of control signals to the HVAC equipment.

10. The system of claim 7, wherein:

the second widget is a pet widget; and executing the different control strategies comprises determining a control signal for the HVAC equipment based on environmental condition limits for a pet.

11. The system of claim 10, wherein an additional widget of the plurality of widgets is an air quality widget.

12. The system of claim 7, wherein the cloud server is located off premise at a different location than the user device.

13. A method of controlling a heating, ventilation, or air conditioning (HVAC) system, the method comprising:

providing a user with a plurality of personalization widgets via a user interface;

receiving a user selection of a first widget and a second widget the plurality of personalization widgets;

controlling the HVAC system by concurrently executing a first control strategy associated with the first widget and a second control strategy associated with the second widget wherein the first widget is an air quality widget, the first control strategy is associated with improving air quality, the second widget is a cost savings widget, and the second control strategy is associated with reducing utility costs;

in response to the first control strategy interfering with the second control strategy, prompting the user to unselect the first widget or the second widget; and controlling the HVAC system in accordance with the second control strategy in response to unselection of the first widget or in accordance with the first control strategy in response to unselection of the second widget.

14. The method of claim 13, wherein the plurality of personalization widgets comprises a sleep quality widget, wherein the method comprises, in response to selection of the sleep quality widget, :

receiving a set of sleep preferences of the user via the user interface; and controlling the HVAC system based on the set of sleep preferences.

15. The method of claim 13, wherein executing the second control strategy comprises:

receiving utility data via a utility provider;

determining a second set of control signals by performing an optimization based on the received utility data; and providing the second set of control signals to the HVAC system.

16. The method of claim 14, wherein the plurality of personalization widgets comprises a pet widget, wherein the method comprises, in response to selection of the pet widget:

obtaining preferred environmental conditions for a pet via the user interface; and controlling the HVAC system based on the preferred environmental conditions for the pet.

17. The method of claim 13, wherein executing the first control strategy comprises:

receiving air quality measurements;

determining a first set of control signals for the HVAC system based on the air quality measurements by executing an control process configured to improve the air quality measurements; and providing the first set of control signals to the HVAC system.

18. The method of claim 13, comprising providing the user interface on a smartphone and executing the first control strategy and the second control strategy at a cloud system.

* * * * *